(12) United States Patent
Ishikawa et al.

(10) Patent No.: US 8,415,858 B2
(45) Date of Patent: Apr. 9, 2013

(54) PIEZOELECTRIC VIBRATING PIECES AND DEVICES, AND METHODS FOR MANUFACTURING SAME

(75) Inventors: Manabu Ishikawa, Saitama (JP); Kenji Shimao, Saitama (JP); Hiroyuki Sasaki, Saitama (JP); Mitoshi Umeki, Saitama (JP); Kenichi Kikuchi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 91 days.

(21) Appl. No.: 13/031,107

(22) Filed: Feb. 18, 2011

(65) Prior Publication Data

US 2011/0227457 A1 Sep. 22, 2011

(30) Foreign Application Priority Data

Feb. 25, 2010 (JP) ................. 2010-039479
Feb. 10, 2011 (JP) ................. 2011-027467

(51) Int. Cl.
*H01L 41/047* (2006.01)
(52) U.S. Cl.
USPC ............................ 310/320; 310/321; 310/344
(58) Field of Classification Search .................. 310/344, 310/321, 320
See application file for complete search history.

(56) References Cited

U.S. PATENT DOCUMENTS

| | | | |
|---|---|---|---|
| 6,362,561 B1 | 3/2002 | Kuroda et al. | |
| 7,579,761 B2 * | 8/2009 | Nishihara et al. | 310/364 |
| 2007/0096596 A1 * | 5/2007 | Naito et al. | 310/320 |
| 2008/0157630 A1 * | 7/2008 | Takahashi | 310/328 |
| 2010/0060108 A1 * | 3/2010 | Yamada | 310/348 |
| 2010/0301709 A1 * | 12/2010 | Onitsuka et al. | 310/344 |

FOREIGN PATENT DOCUMENTS

| | | |
|---|---|---|
| JP | 2000-269774 | 9/2000 |
| JP | 2006-157554 | 6/2006 |
| JP | 2007-189414 | 7/2007 |
| JP | 2007-189492 | 7/2007 |
| JP | 2008-109538 | 5/2008 |
| JP | 2008-236514 | 10/2008 |
| JP | 2010-028610 | 2/2010 |
| JP | 2010-041109 | 2/2010 |

OTHER PUBLICATIONS

Office Action for related Japanese Patent Application No. 2011-027467, 4 pages, Oct. 1, 2012 (in Japanese).

* cited by examiner

*Primary Examiner* — Walter Benson
*Assistant Examiner* — Bryan Gordon
(74) *Attorney, Agent, or Firm* — Klarquist Sparkman, LLP

(57) ABSTRACT

Piezoelectric vibrating pieces are disclosed having selectively roughened surfaces. An exemplary piece is made of a piezoelectric material configured as a piezoelectric substrate. The piece also includes at least one excitation electrode and at least one extraction electrode. The substrate has opposing main surfaces initially having low surface roughness. At least one main surface is formed in a mesa or reverse mesa manner, wherein the central region has a different thickness than the peripheral region. The central region has relatively low surface roughness (irregular unevenness), while the peripheral region has relatively high surface roughness. The excitation electrode is formed on the central region (mesa or reverse mesa) while the extraction electrode (connected to the excitation electrode) is formed on the peripheral region.

6 Claims, 14 Drawing Sheets

FIG.4
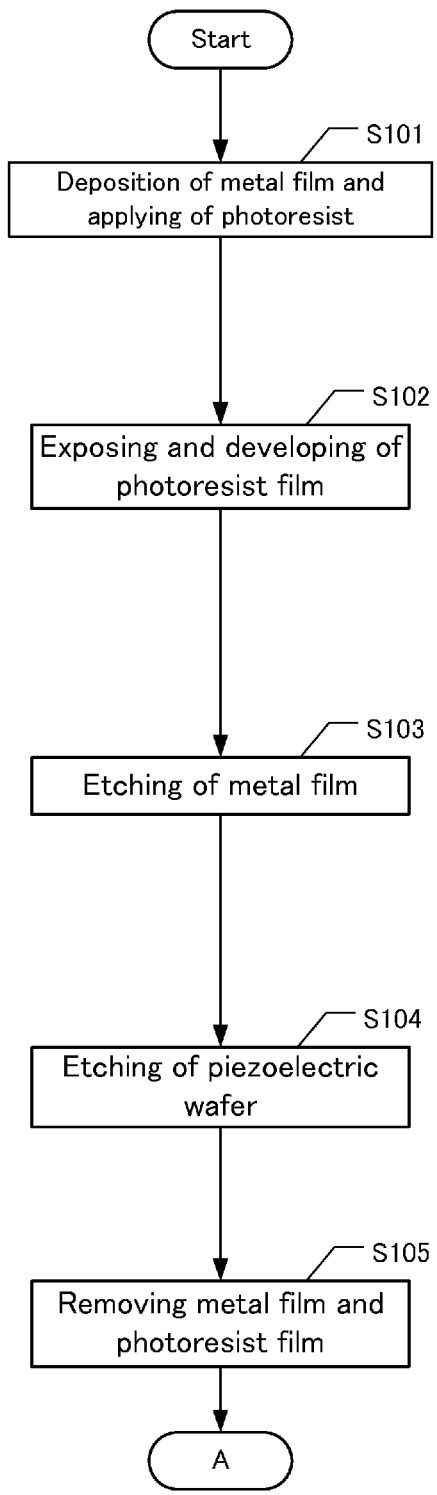
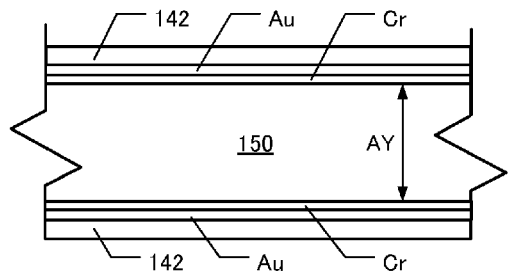
FIG.4A
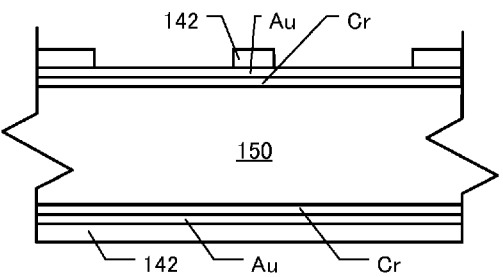
FIG.4B
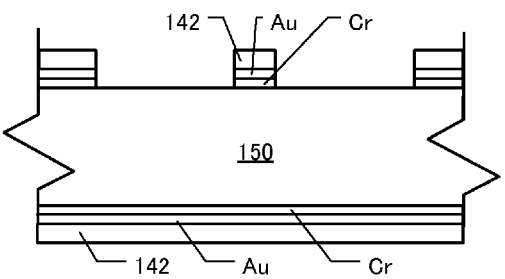
FIG.4C
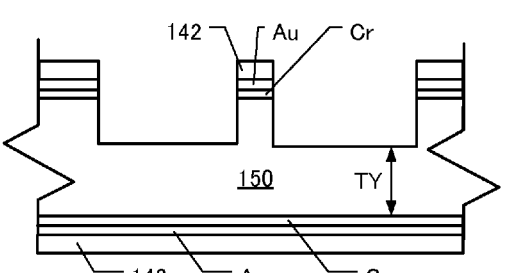
FIG.4D
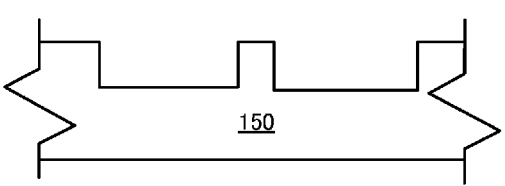
FIG.4E
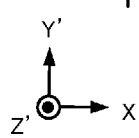

FIG.5
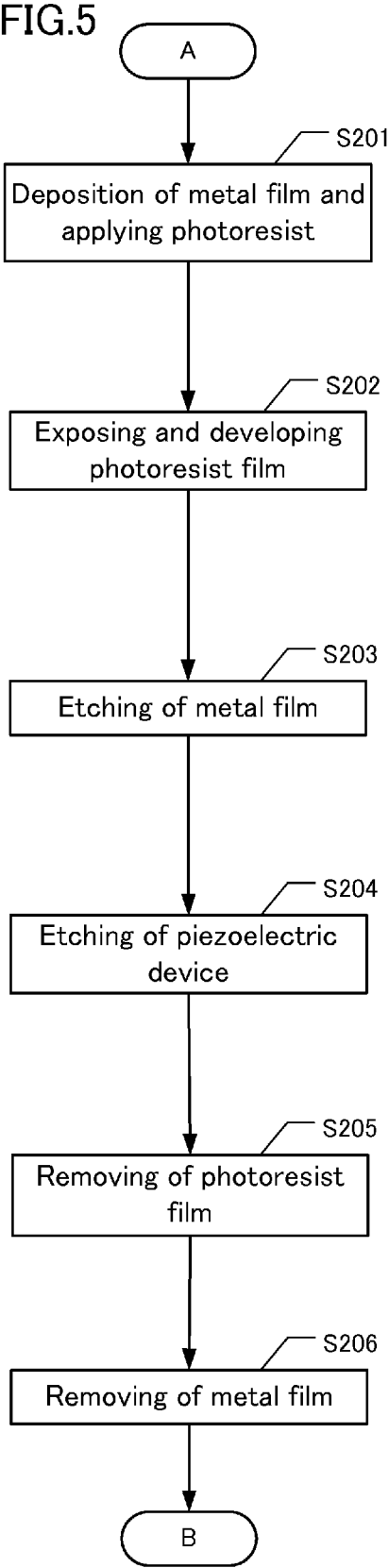
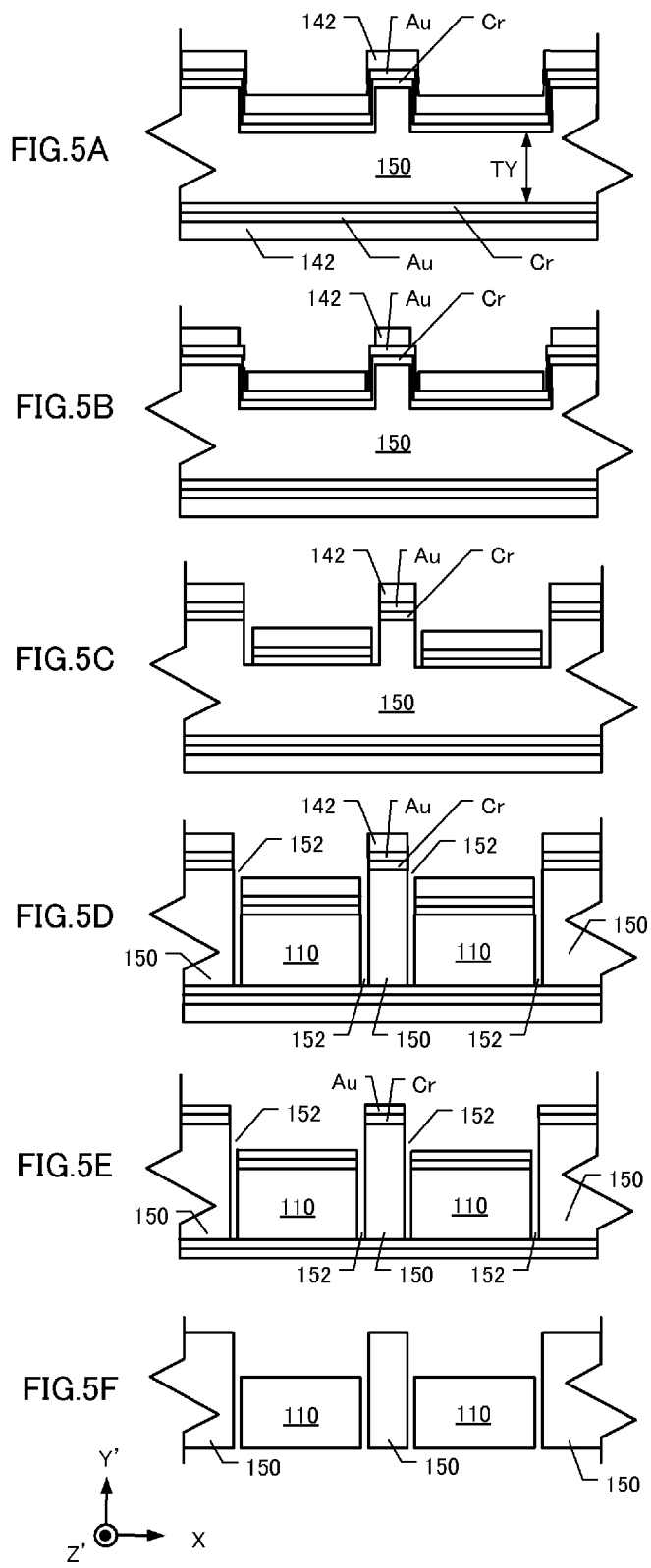

FIG.6
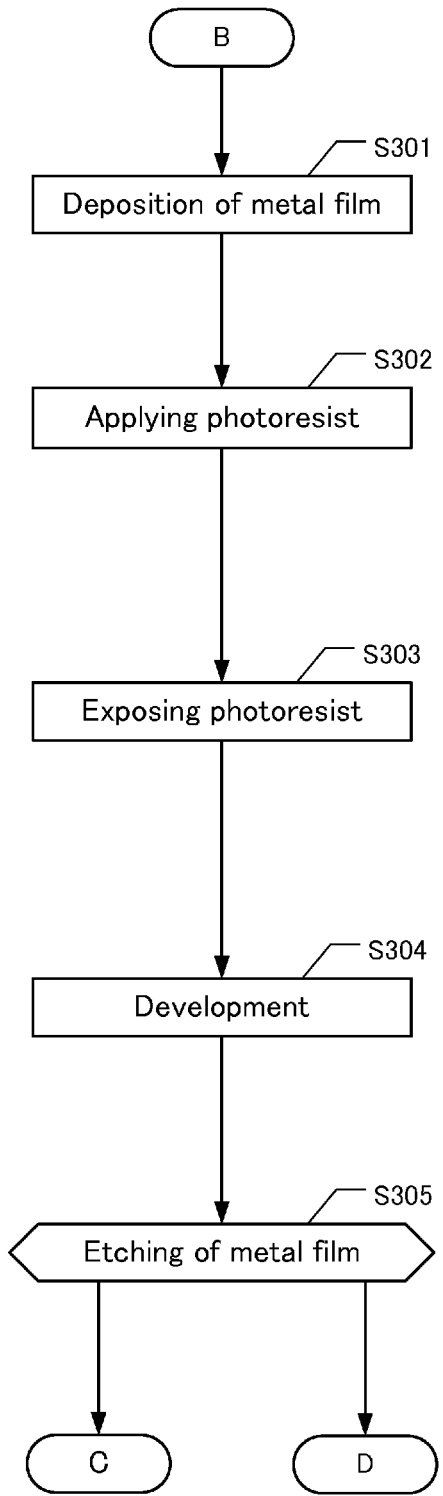
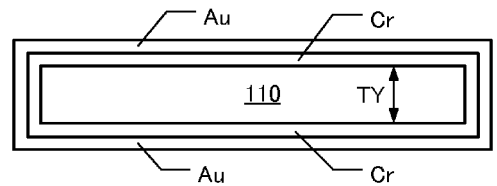
FIG.6A
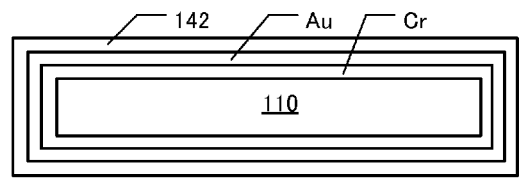
FIG.6B
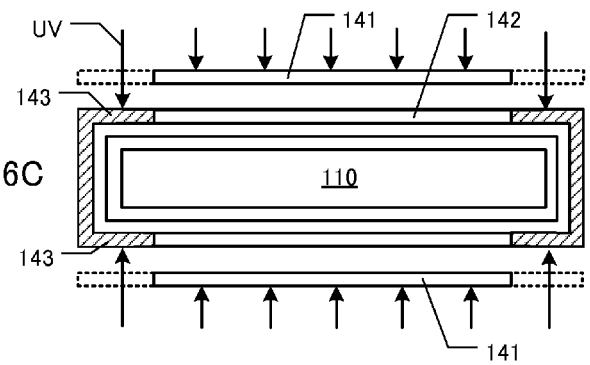
FIG.6C
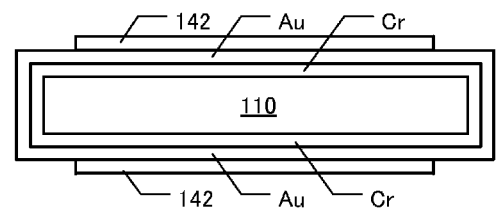
FIG.6D
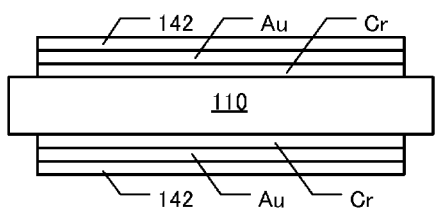
FIG.6E
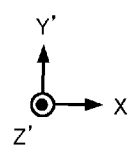

FIG.7
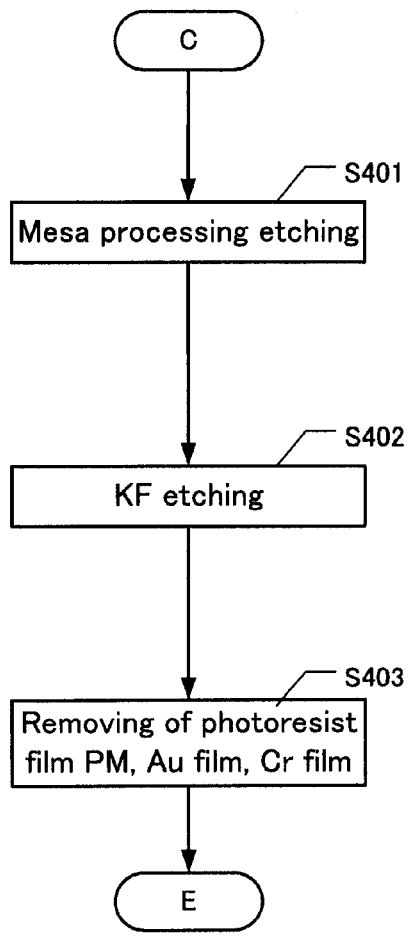
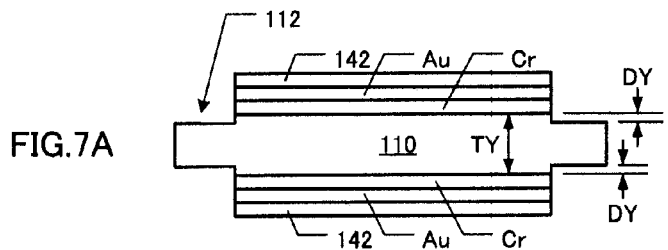
FIG.7A
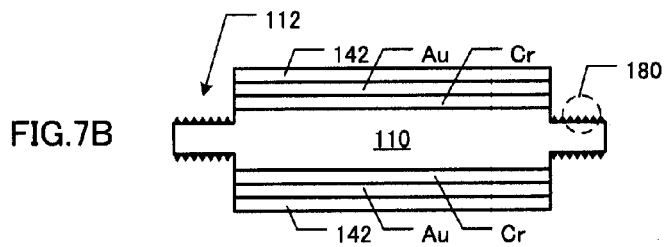
FIG.7B
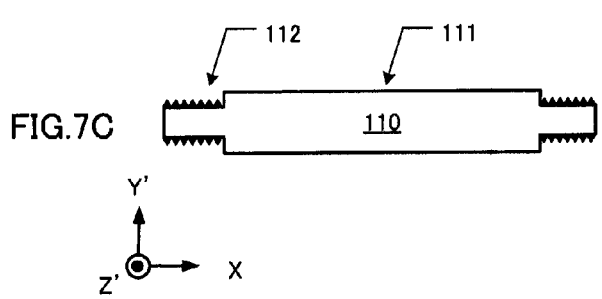
FIG.7C
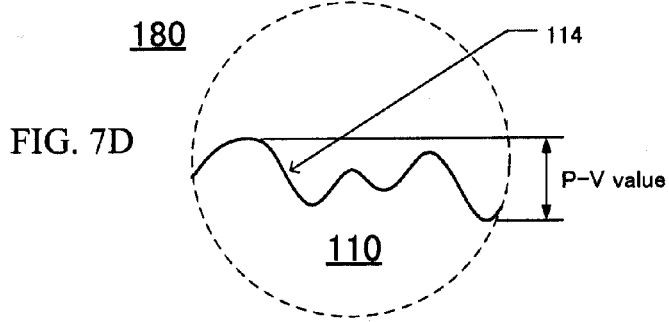
FIG. 7D FIG. 8
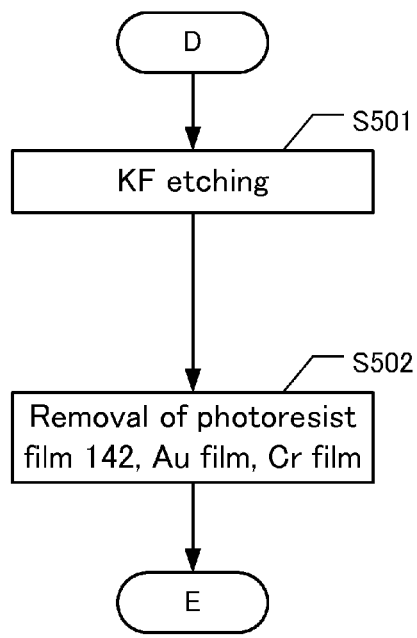
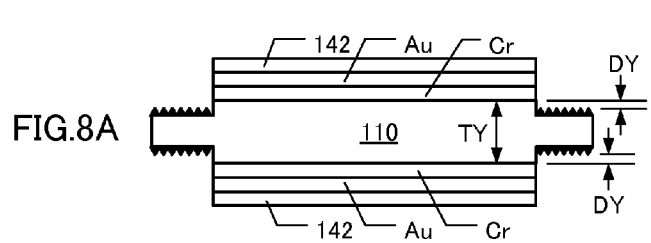
FIG. 8A
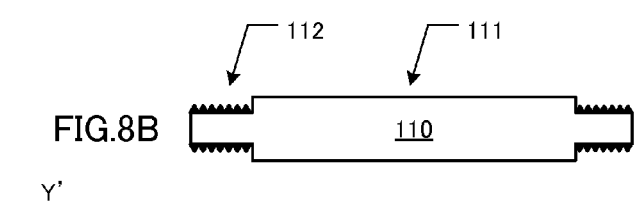
FIG. 8B FIG.9
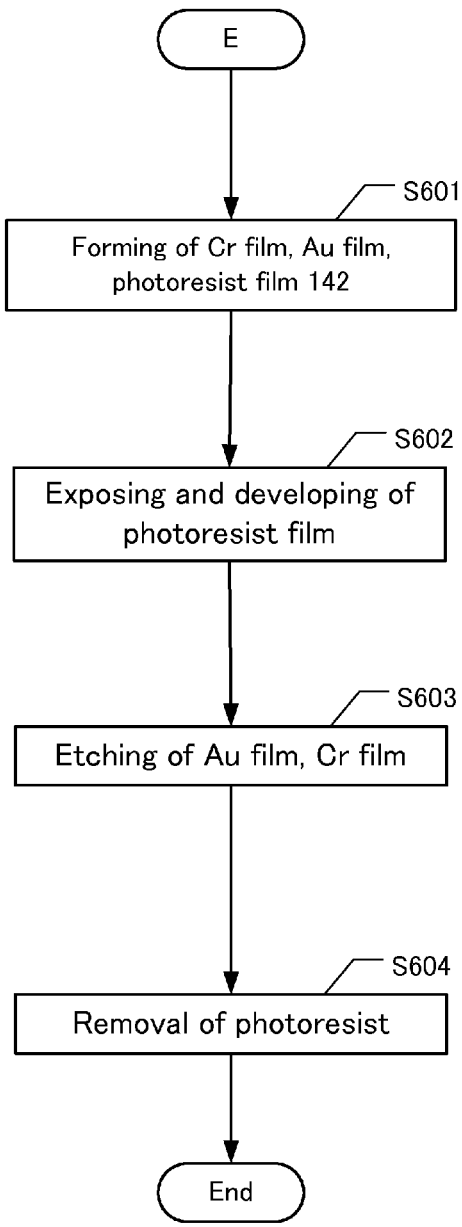
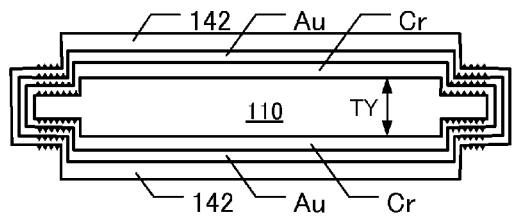
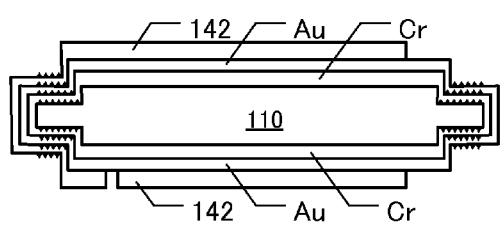
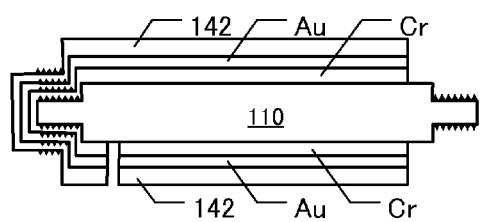
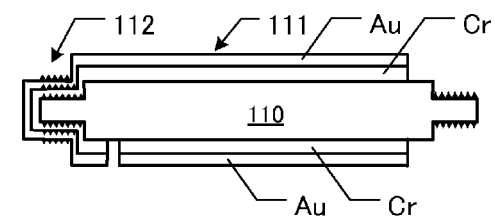
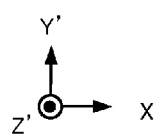

FIG. 11
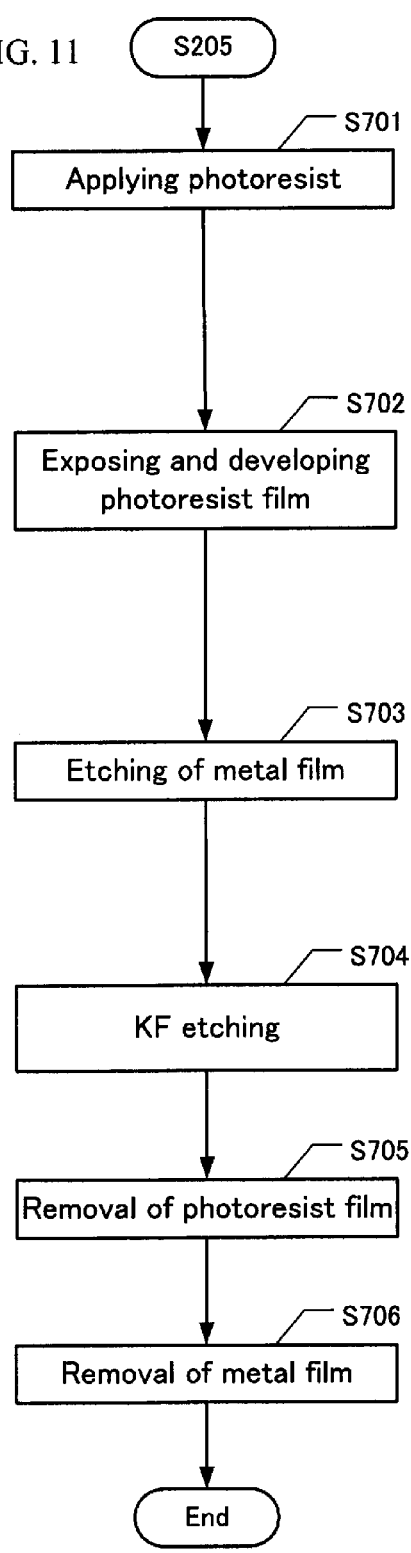
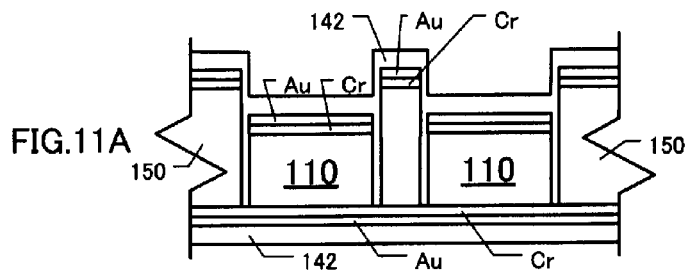
FIG.11A
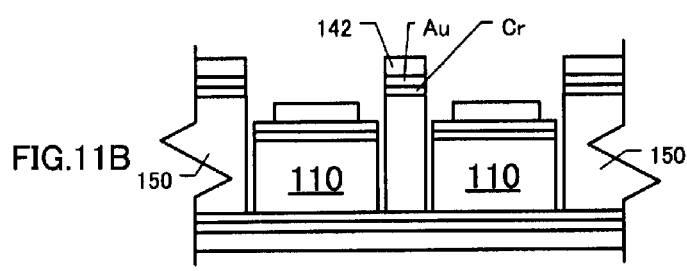
FIG.11B
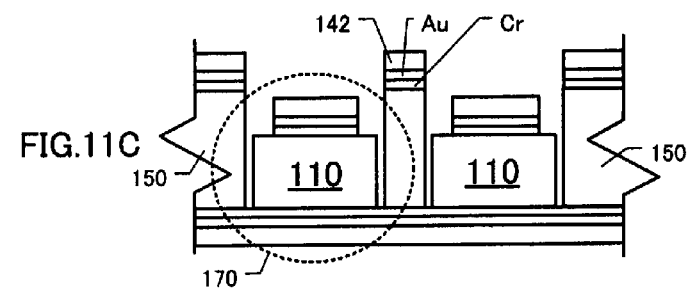
FIG.11C
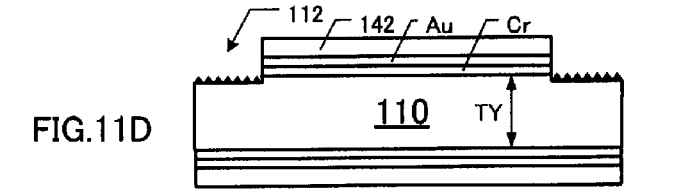
FIG.11D
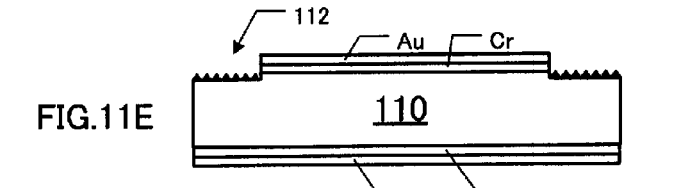
FIG.11E
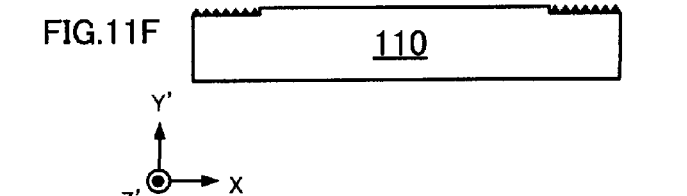
FIG.11F

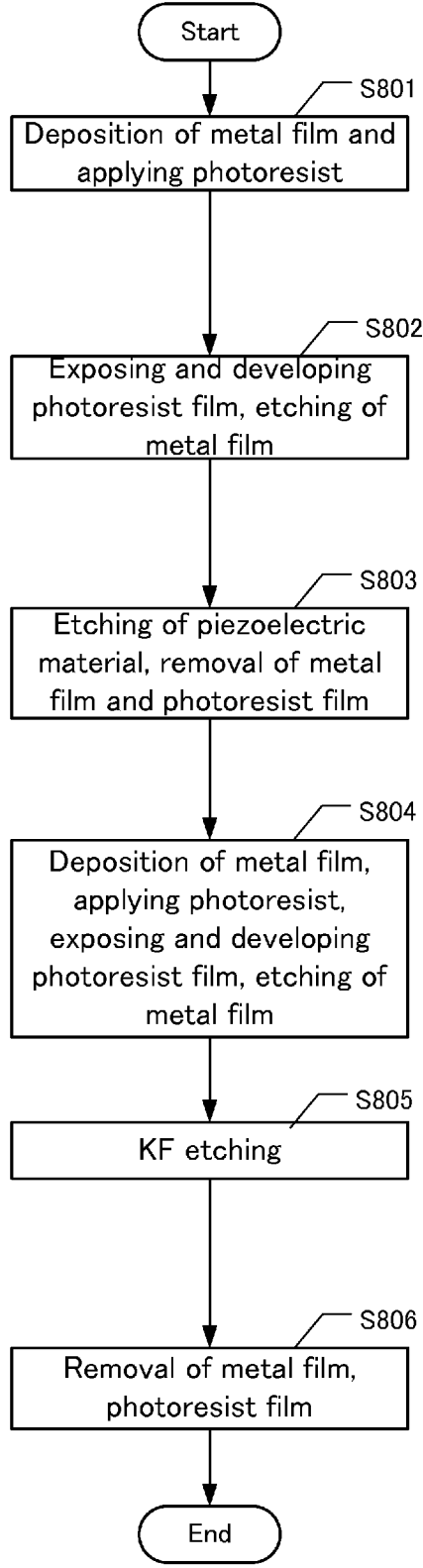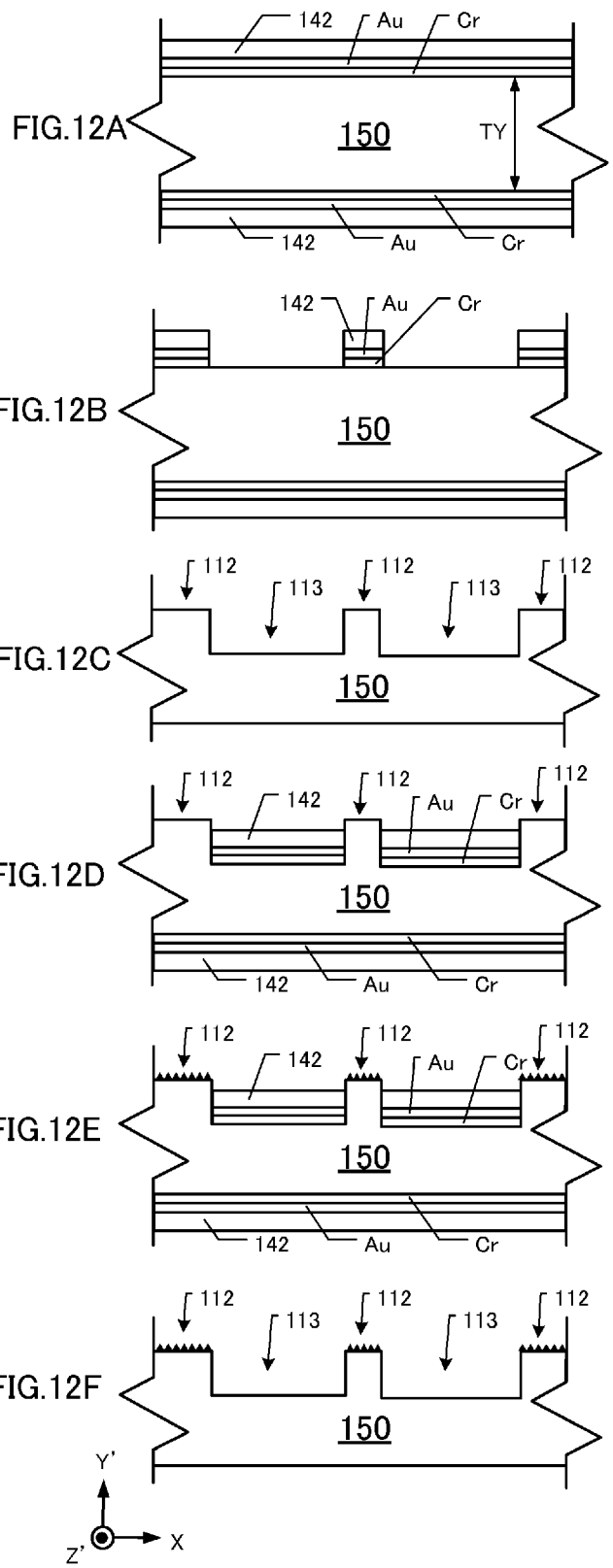

FIG.14
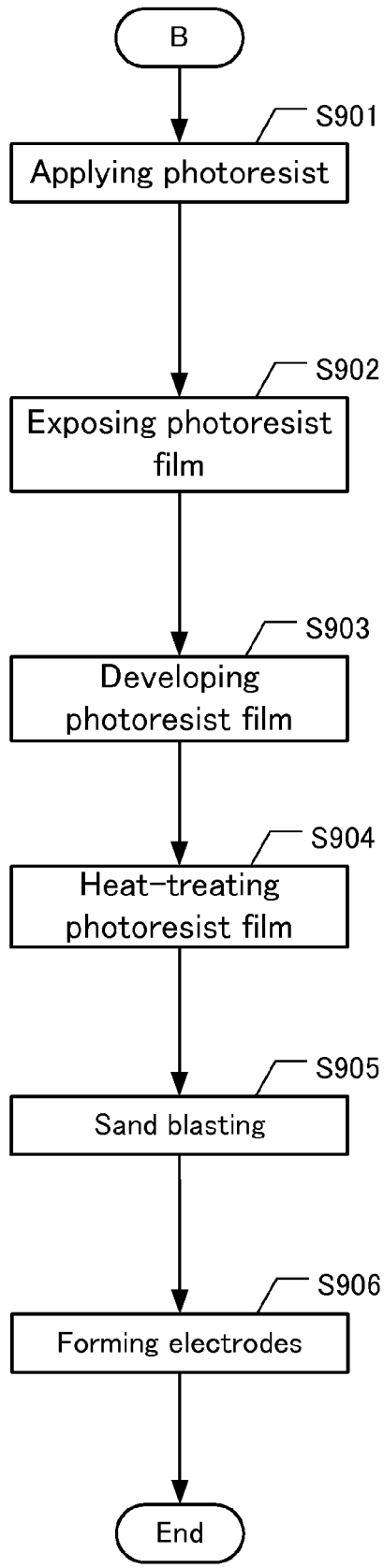
- S901 Applying photoresist — FIG.14A 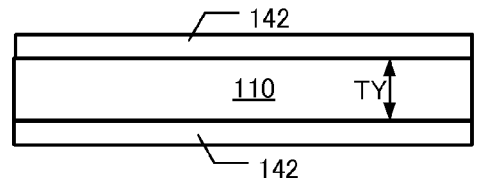
- S902 Exposing photoresist film — FIG.14B 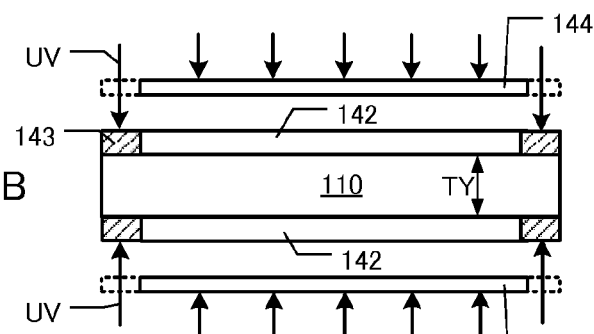
- S903 Developing photoresist film — FIG.14C 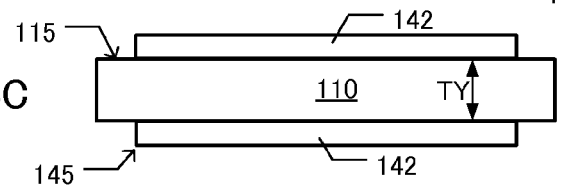
- S904 Heat-treating photoresist film — FIG.14D 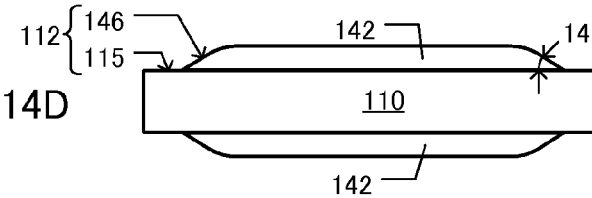
- S905 Sand blasting — FIG.14E 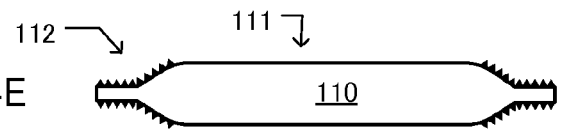
- S906 Forming electrodes — FIG.14F 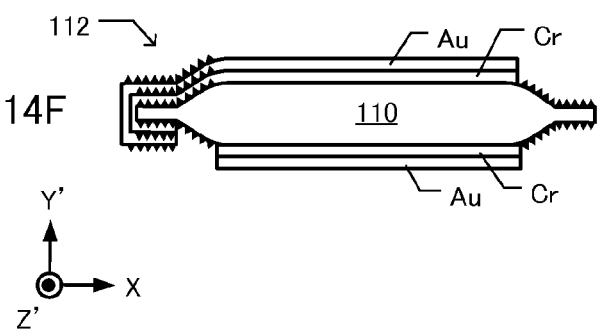

PIEZOELECTRIC VIBRATING PIECES AND DEVICES, AND METHODS FOR MANUFACTURING SAME

CROSS-REFERENCE TO RELATED APPLICATION

This application claims priority to and the benefit of No. 2010-039479 filed on Feb. 25, 2010, and Japan Patent Application No. 2011-027467 filed on Feb. 10, 2011, in the Japan Patent Office, the respective disclosures of which being incorporated herein by reference in their respective entireties.

FIELD

This disclosure pertains to, inter alia, methods for manufacturing a surface-mountable type piezoelectric vibrating piece. The disclosure also pertains to piezoelectric vibrating pieces and to piezoelectric devices including such piezoelectric vibrating pieces.

DESCRIPTION OF THE RELATED ART

With the ongoing miniaturization of electronic devices, components used in them also must be progressively miniaturized. The relentless drive for further miniaturization has raised certain challenges. For example, some electronic devices include surface-mounted crystal vibrators comprising miniaturized piezoelectric vibrating pieces mounted inside device packages. As piezoelectric vibrating pieces have become progressively smaller, bonding them inside their respective packages using an electrically conductive adhesive becomes increasingly difficult to perform in a manner that achieves sufficient bond strength.

The piezoelectric device disclosed in Japan Unexamined Patent Application No. 2008-109538 includes a lattice-shaped rough surface on which extraction electrodes are formed. Rough surfaces, due to their relatively large microconvexities, have greater surface area than smooth surfaces (having relatively small microconvexities). In other words, a rougher surface has a greater surface area than otherwise would be indicated solely by the geometric dimensions of the surface, compared to a less-rough surface. Extraction electrodes are very thin; hence, when formed on a surface, the extraction electrode retains the same roughness as of the surface on which it is formed. An extraction electrode formed on a rough provides a larger bonding area for adhesive, compared to an extraction electrode foamed on a mirror-polished surface (or less-rough surface) having the same geometric dimensions.

However, forming the rough surfaces of the crystal vibrating piece disclosed in the '538 document requires many manufacturing steps, including fowling a metal film in peripheral regions of the crystal vibrating piece, applying a photoresist, exposing a lattice-shaped pattern into the photoresist, and then etching the peripheral regions according to the pattern. This method is complicated and expensive, and thus adversely affects productivity.

The present invention provides, inter alia, piezoelectric vibrating pieces that include roughened peripheral regions formed by an easier, less complicated process than that disclosed in the '538 reference, while still providing a way to firmly affix the vibrating pieces to their respective packages using electrically conductive adhesive. Also provided are easier and less complicated methods for manufacturing piezoelectric vibrating pieces.

SUMMARY

Advantages of the present invention are realized by various aspects of the invention. A first aspect is directed to piezoelectric vibrating pieces made of a piezoelectric material. An embodiment comprises a piezoelectric substrate comprising first and second main surfaces. A respective first region is formed on at least one of the main surfaces. This first region includes a respective surface having a first degree of irregular unevenness ("roughness"). A respective second region surrounds each first region. The second region has a second degree of irregular unevenness that is greater than the first degree. A respective excitation electrode is located in the first region, and a respective extraction electrode is located in the second region and is electrically connected to the respective excitation electrode. Each extraction electrode has a respective surface that is rough according to the roughness of the underlying second region.

The respective roughness of each of the subject surfaces is largely due to multiple microconvexities having irregular heights on the surfaces. Rougher surfaces have larger microconvexities than smoother, more "polished," surfaces. Since the extraction electrode is formed directly on the surface of the peripheral region having relatively large surface roughness, the surface of the extraction electrode also includes microconvexities; these microconvexities correlate to respective microconvexities on the surface of the underlying peripheral region.

A particularly desirable manner of forming these roughened surfaces is by wet-etching using potassium fluoride or hydrofluoric acid at 90° C.

The excitation electrode desirably is formed in the first region so as to be centrally located on the respective main surface. The second region, having a rougher surface than the first region, is peripheral to the first region.

The first region of at least one main surface of the piezoelectric substrate has a mesa or reverse mesa configuration. The maximum difference in height of the microconvexities on the surface of the peripheral region is greater than or equal to 5% and less than or equal to 50% of the height of the mesa relative to the peripheral region. In some embodiments the second region includes a circumferential region of the piezoelectric vibrating piece. The circumferential region is connected to the first region by a slope, wherein the slope is angled at less than 90° relative to the main surface of the mesa. A desirable range of angles is 5° to 80°.

Another aspect is directed to piezoelectric devices that comprise a piezoelectric vibrating piece as summarized above. The package defines a cavity that contains the piezoelectric vibrating piece. A connecting electrode is in the cavity. The package includes a lid for sealing the package. An electrically conductive adhesive electrically connects the extraction electrodes to their respective connecting electrodes.

Another aspect is directed to methods for manufacturing piezoelectric vibrating pieces. An embodiment of the method comprises preparing a piezoelectric substrate having first and second main surfaces each having a mirror surface of which the irregular unevenness ("roughness") of the microconvexities is small (i.e., small microconvexities and small differences in height of the microconvexities). A metal film is formed on both main surfaces, followed by application of a photoresist film on the metal film. The photoresist film is exposed in the peripheral region, avoiding exposure of a central region. Subsequent removal of the exposed photoresist denudes the underlying metal film, and removal of the denuded metal film denudes the underlying substrate. A first etching step is performed of the denuded regions of the substrate using a first etchant, to form respective mesa regions in the central regions. The mesa region is higher than the surrounding peripheral region. A second etching step is performed to roughen the surface in the peripheral region. The roughened surface has microconvexities that are larger and that exhibit greater differences in height than the microconvexities of the mesa surface (which still has the mirror surface). The second etchant is different from the first etchant. An excitation electrode is formed in the central region, and an extraction electrode (connected to the excitation electrode) is formed in the peripheral region.

In another embodiment of the methods, a piezoelectric substrate is prepared having first and second main surfaces. The main surfaces have a mirror finish of which the microconvexities are small and have relatively small differences in height. A metal film is formed on both main surfaces, and a photoresist film is formed on the metal film. The photoresist film in a peripheral region of the substrate (but not in a central region) is exposed. Removal of exposed photoresist denudes the underlying metal film, and removal of the underlying metal film denudes the underlying substrate material destined to become the peripheral region. A first etching step is performed to roughen the peripheral region. This roughened surface has microconvexities that are larger and that exhibit greater differences in height than the microconvexities of the mirror surface, and is formed by exposing the peripheral region with a second etchant different from the first etchant. A mesa region is formed by exposing the piezoelectric material, denuded by removal of the metal film, with a second etchant. The mesa region is situated in the central region. An excitation electrode is formed on the mesa, and an extraction electrode, connected to the excitation electrode, is formed in the peripheral region.

In the methods summarized above, the exposing step can be limited to exposing the photoresist film of one main surface of the piezoelectric substrate. Alternatively, the exposing step can result in exposure of the photoresist film on both main surfaces.

In the methods summarized above, the first etchant can comprise potassium fluoride, and the second etchant can be a reactant gas of $CF_4$, $F_4F_8$, or $CHF_3$, or mixtures thereof. Alternatively, the first etchant can comprise hydrofluoric acid or buffered hydrofluoric acid at a first concentration and temperature, while the second etchant can comprise hydrofluoric acid that is higher in concentration and temperature than the first etchant.

The roughened surface of the extraction electrode allows the electrode to be firmly affixed to the package using an electrically conductive adhesive, as a result of the enhanced surface area of the extraction electrode resulting from the electrode being formed on a rough surface. The methods described herein provide easy and simple formation of the extraction electrode.

In another embodiment of a method for manufacturing a piezoelectric vibrating piece, a piezoelectric substrate is prepared having first and second main surfaces that have a mirror finish exhibiting relatively low unevenness height differences (i.e., relatively small microconvexities having relatively small differences in height). A photoresist film is formed on both main surfaces. The photoresist film on both main surfaces is exposed and developed in a peripheral region that surrounds a central region of the piezoelectric substrate. (The photoresist film in the central region is not exposed.) The unexposed photoresist film on the substrate is heat-treated. On both main surfaces the peripheral region is sand-blasted to surface-roughen the peripheral region to have unevenness height differences that are high relative to the unevenness height differences of the mirror finish in the central region. I.e., the surface-roughened peripheral region has microconvexities that are larger and that exhibit greater differences in height than the microconvexities of the mirror surface. The sand-blasting also reduces the thickness of the peripheral region relative to the central region, thereby forming the central region as a mesa relative to the peripheral region. On at least one main surface, a respective excitation electrode is formed on the mesa. Also, on at least one main surface, a respective extraction electrode is formed in the roughened peripheral region.

The foregoing and other features and advantages of the invention will be more readily apparent from the following detailed description, which proceeds with reference to the accompanying drawings.

BRIEF DESCRIPTION OF THE DRAWINGS

FIG. 4 is a flow-chart of a first portion of an embodiment of a method for forming steps in the peripheral thickness of a piezoelectric substrate.

FIGS. 4A-4E depict the results of respective steps shown in the adjacent flow-chart of FIG. 4.

FIG. 5 is a flow-chart of a second portion of the method, particularly forming steps around through-holes. FIG. 5 begins where FIG. 4 ends.

FIGS. 5A-5F depict the results of respective steps shown in the adjacent flow-chart of FIG. 5.

FIG. 6 is a flow-chart of a third portion of the method, particularly forming steps in the mesa region 111. FIG. 6 begins where FIG. 5 ends.

FIGS. 6A-6E depict the results of respective steps shown in the adjacent flow-chart of FIG. 6.

FIG. 7 is a flow-chart of a method for performing mesa-process etching and surface roughening separately.

FIGS. 7A-7C depict the results of respective steps shown in the adjacent flow-chart of FIG. 7.

FIG. 7D is an enlargement of the region circumscribed by the dashed line 180 in FIG. 7B.

FIG. 8 is a flow-chart of a method for performing mesa-process etching and surface roughening simultaneously.

FIGS. 8A and 8B depict the results of respective steps shown in the adjacent flow-chart of FIG. 8.

FIG. 9 is a flow-chart of a method for forming steps on electrodes on the piezoelectric substrate.

FIGS. 9A-9D depict the results of respective steps shown in the adjacent flow-chart of FIG. 9.

FIG. 11 is a flow-chart of an embodiment of a method for performing surface roughening on a plate piezoelectric substrate.

FIGS. 11A-11F depict the results of respective steps shown in the adjacent flow-chart of FIG. 11.

FIG. 12 is a flow-chart of an embodiment of a method for performing surface roughening on an inverted-mesa type piezoelectric substrate.

FIGS. 12A-12F depict the results of respective steps shown in the adjacent flow-chart of FIG. 12.

FIG. 14 is a flow-chart of an embodiment of a method for performing both surface-roughening and mesa-processing by sand-blasting a selected region on a main surface of the piezoelectric substrate.

FIGS. 14A-14F depict the results of respective steps shown in the adjacent flow-chart of FIG. 14.

DETAILED DESCRIPTION

Various embodiments of the present invention are described in detail below with reference to the accompanying figures. It will be understood that the scope of the invention is not limited to the described embodiments.

First Embodiment of Piezoelectric Vibrating Piece

Figure 1A:
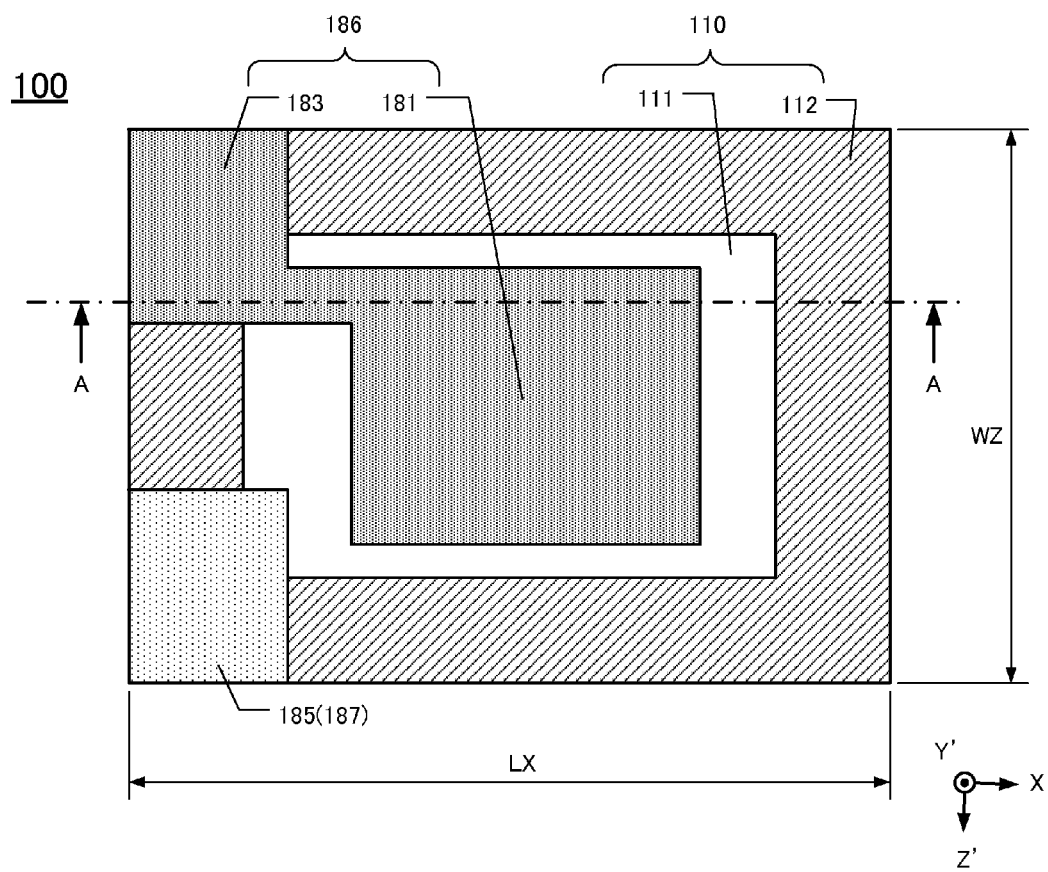
FIG. 1A is a plan view of a first embodiment of a piezoelectric vibrating piece.
Figure 1B:
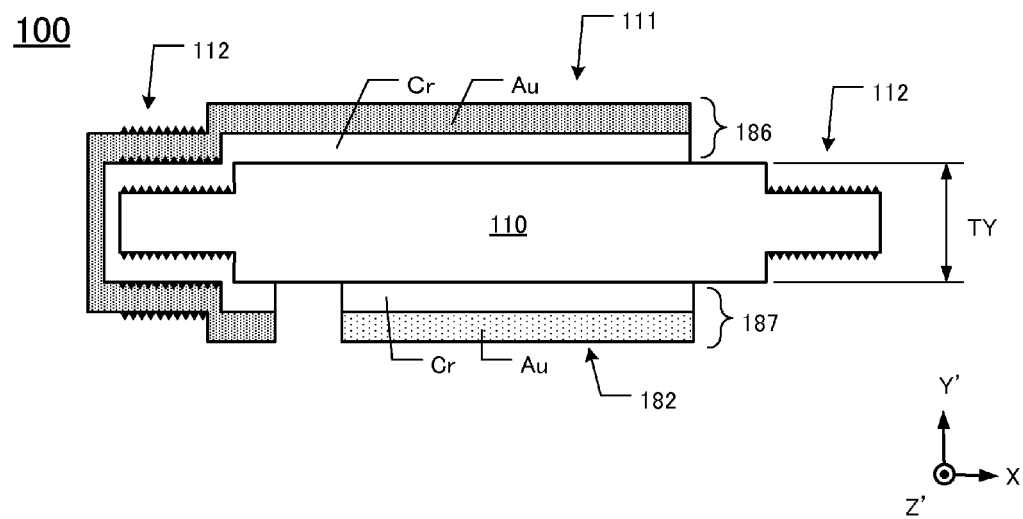
FIG. 1B is a cross-sectional view along the line A-A in FIG. 1A.

FIGS. 1A and 1B are plan and cross-sectional views, respectively, of a piezoelectric vibrating piece 100 of this embodiment. The cross-sectional view in FIG. 1B is along the line A-A in FIG. 1A.

The piezoelectric vibrating piece 100 has a piezoelectric substrate 110. When appropriately energized, the vibrating piece 100 oscillates at a frequency of 4 MHz, for example. It comprises a unit of AT-cut crystal that exhibits thickness-shear vibration in the X-axis direction. In an AT-cut crystal a main surface of the crystal piece orthogonal to the Y-axis (of the X, Y, Z crystal axes) rotates about 35°15″ about the X-axis from the Y-axis direction to the Z-axis direction. The piece 100 has a rectangularly shaped main surface and has a thickness in the Y'-axis direction. In this description, the length of the piezoelectric vibrating piece 100 is in the X-axis direction and the width is in the Z'-axis direction.

In plan profile, an exemplary piezoelectric vibrating piece 100 has, for example, a length LX of about 1 mm, a width WZ of about 0.7 mm, and a thickness TY (see FIG. 1B) of about 0.042 mm. The piezoelectric vibrating piece 100 has a "mesa" configuration in which the rectangular main surface has a center region 111 that is thicker than the peripheral region 112.

The central region 111 is termed herein the "mesa region," and the peripheral thinner region is termed the "peripheral region" 112. Respective mesa regions 111 are present on the main surface on the +Y-side and the main surface on the −Y-side. Both mesa regions 111 have the same shape, and the surface of each is mirror-finished so that, on a microscopic scale, "microconvexities" on the surface are relatively small and have relatively low differences in height (compared to microconvexities in the rougher peripheral regions 112, see below). For example, the difference in height between the highest microconvexity and the lowest microconvexity on the mirrored surface is ≦0.1 µm. (The lower the difference, the more "polished" or "smoother" the surface.) On the main surface of the +Y-side, the mesa region 111 includes a first excitation electrode 181, and on the main surface of the −Y-side, the mesa region 111 includes a second excitation electrode 182. By applying a voltage across the excitation electrodes 181, 182, the piezoelectric vibrating piece 110 is induced to vibrate.

The peripheral regions 112 are roughened so that their respective surfaces have relatively larger microconvexities exhibiting relatively large differences in height. Such a surface has a larger surface area than would be indicated solely by its X-Z' dimensions. Extraction electrodes 183, 184 are formed on respective peripheral regions 112. As a result of the enhanced surface area of the peripheral regions 112 due to surface roughening, the surfaces of the extraction electrodes 183, 184 are similarly rough and likewise have enhanced surface areas. The extraction electrodes connect respective excitation electrodes 181, 182 to respective external electrodes. The excitation electrode 181 and its extraction electrode 183 comprise a first electrode 186, and the excitation electrode 182 and its extraction electrode 184 comprise a second electrode 187. The electrodes 186, 187 are symmetrically placed on the upper and lower (first and second, respectively) main surfaces, respectively, of the piezoelectric vibrating piece 100.

FIG. 1B is a cross-sectional view along the line A-A in FIG. 1A. Each electrode 186, 187 comprises a chromium (Cr) layer and a gold (Au) layer. Since it is difficult to form the Au layer directly on the piezoelectric substrate 110, the Cr layer is formed first, directly on the piezoelectric substrate 110, and then the Au layer is formed on the Cr layer.

First Embodiment of Piezoelectric Vibrator

A piezoelectric vibrating piece 100 mounted inside a "package" is called a "piezoelectric vibrator" 1000. This embodiment of a piezoelectric vibrator 1000, which incorporates the first embodiment of a piezoelectric vibrating piece 100, is described below with reference to FIGS. 2A and 2B.

Figure 2A:
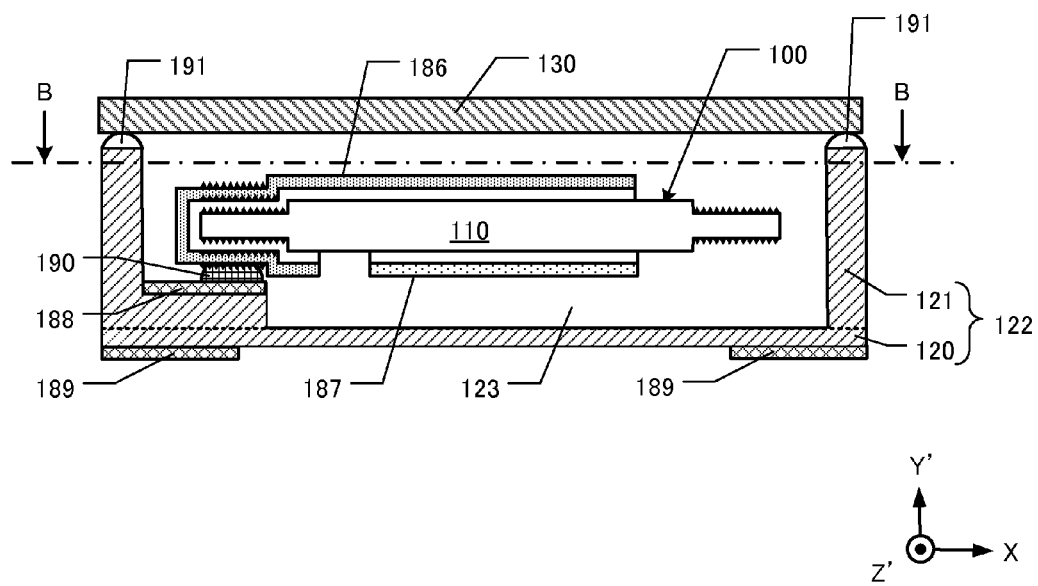
FIG. 2A is a plan view of a first embodiment of a piezoelectric vibrator.
Figure 2B:
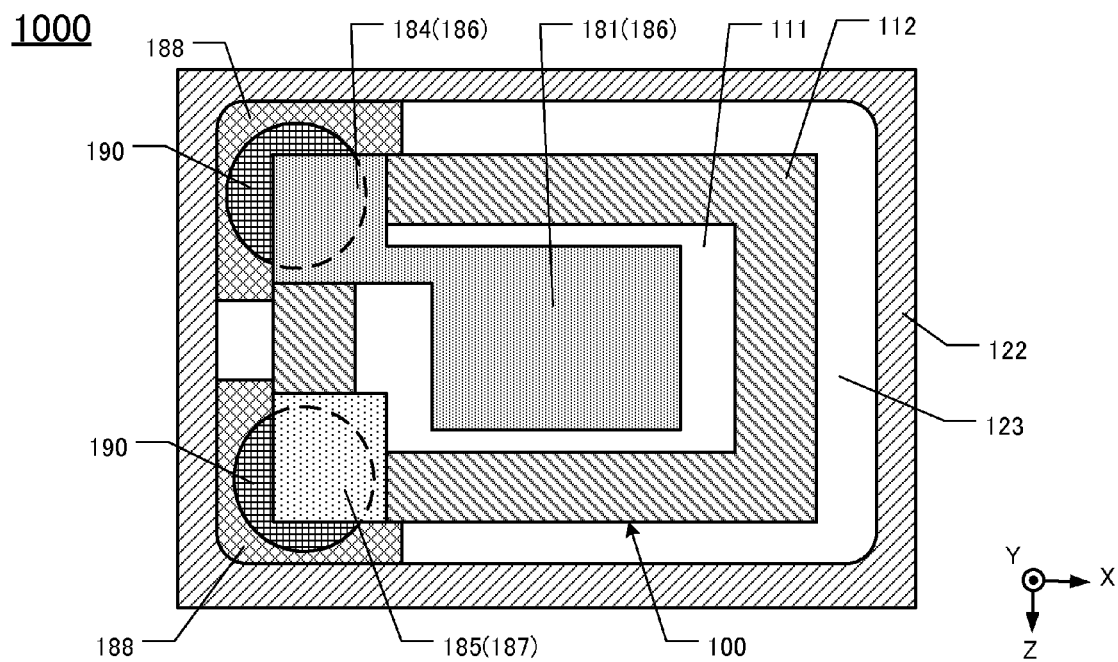
FIG. 2B is a cross-sectional view along the line B-B in FIG. 2A.

FIG. 2A is a cross-sectional view of the piezoelectric vibrator 1000. FIG. 2B is a cross-sectional view along the line B-B of FIG. 2A. The piezoelectric vibrator 1000 comprises the piezoelectric vibrating piece 100, a package 122, and a lid 130. The package 122 is a box having a cavity 123 defined by sides 121 and a base portion 120. The lid 130 is bonded to the package 122 by a sealing material 191 that hermetically seals the cavity 123 from the outside environment. Connecting electrodes 188 are formed at two locations inside the package 122 (one for each respective electrode 186, 187). External electrodes 189, connected to respective connecting electrodes 188, are formed at respective locations outside the package 122.

The piezoelectric vibrating piece 100 is connected to the connecting electrodes 188 via the extraction electrodes 183, 184 using an electrically conductive adhesive 190. The electrodes 186, 187 are electrically connected to their respective connecting electrodes 188. The connecting electrodes 188 are electrically connected to their respective external electrodes 189 via conductive wiring (not shown) that fully penetrates the package 122 from inside to outside. Thus, the first and second electrodes 186, 187 are electrically connected to respective external electrodes 189. To cause vibration of the piezoelectric vibrating piece 100, a voltage is applied across the excitation electrodes 181, 182 via the respective external electrodes 189.

Each main surface of the piezoelectric vibrating piece 100 includes a respective centrally located mesa region 111 and a respective peripheral region 112. In the Y'-direction, it is thinner between the peripheral regions 112 and thicker between the mesa regions 111. This configuration confines vibrational energy to the center regions of the vibrating crystal piece 100 and reduces crystal impedance (CI). CI is also reduced by forming the excitation electrodes 181, 182 on respective mesa regions 111 each having a mirror surface (i.e., a surface with relatively low roughness). Also, by forming the extraction electrodes 182, 183 on the rougher surfaces of the respective peripheral regions 112, the surface area available in the extraction electrodes for achieving good-quality bonding using the electrically conductive adhesive 190 is effectively increased. This greater surface area provides greater bonding strength of the adhesive 190 to the extraction electrodes 183, 184, and correspondingly better electrical conduction from electrode to electrode, which also reduces CI. The rougher surfaces of the peripheral regions also attenuate unnecessary vibrations that otherwise would arise, thereby further reducing CI.

First Embodiment of Method for Manufacturing Piezoelectric Vibrating Piece

Multiple piezoelectric vibrating pieces 100 can be produced simultaneously by forming them, according to this method, on a piezoelectric wafer 150 having a size sufficient for forming a large number of pieces.

Figure 3A:
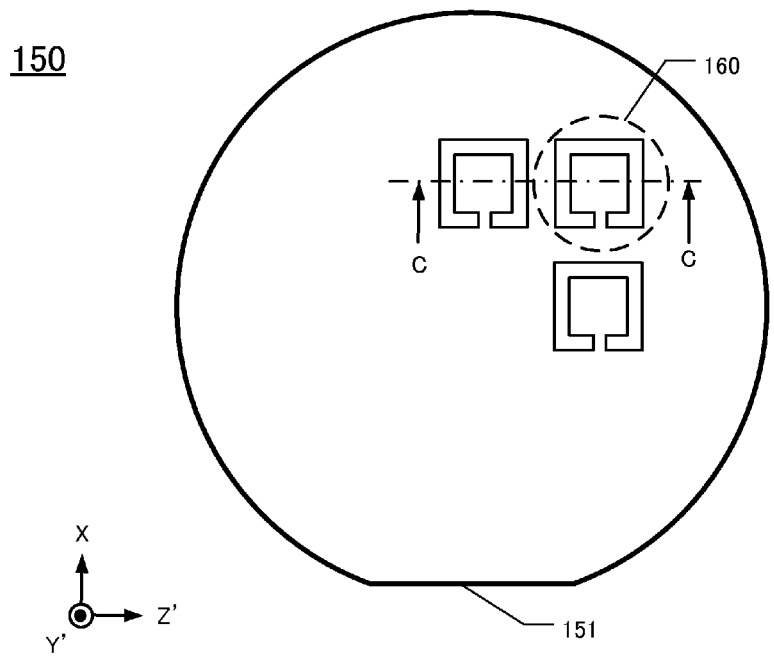
FIG. 3A is a plan view of an exemplary piezoelectric wafer.

FIG. 3A is a plan view of the piezoelectric wafer 150, which includes an orientation flat 151 along part of the edge of the wafer. The flat 151 defines a referenced crystal-lattice direction. The piezoelectric wafer 150 is made of a synthetic crystal material, such as quartz crystal. Both its upper and lower surfaces are polished to a mirror finish exhibiting a very low degree of surficial unevenness (i.e., low "roughness," e.g., $\leq 0.1$ μm). The diameter of the wafer 150 is about three to four inches. Multiple piezoelectric vibrating pieces 100 are formed on the piezoelectric wafer 150. FIG. 3A shows three piezoelectric vibrating pieces 100 for illustrative purposes only (typically a large number of vibrating pieces 100 are formed on the wafer 150). Within the dotted-line area 160 is a single piezoelectric vibrating piece 100.

Figure 3B:
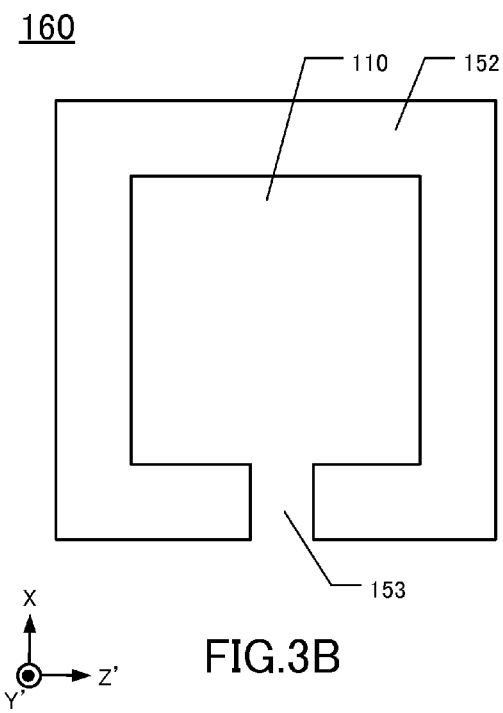
FIG. 3B is an enlargement of the region 160 in FIG. 3A.

FIG. 3B is an enlarged view of the region 160 in FIG. 3A. The plan profile of the piezoelectric vibrating piece 100 is defined by forming a through-channel 152. The "through-channel" fully penetrates the thickness of the piezoelectric wafer 150. At this time in the process, the piezoelectric vibrating pieces 100 are still connected to the piezoelectric wafer 150 by respective connecting portions 153. The portion connected to the wafer is the piezoelectric substrate 110. In later steps, the mesa region 111 and the electrodes 186, 187 are formed on the piezoelectric substrate 110.

Figure 3C:
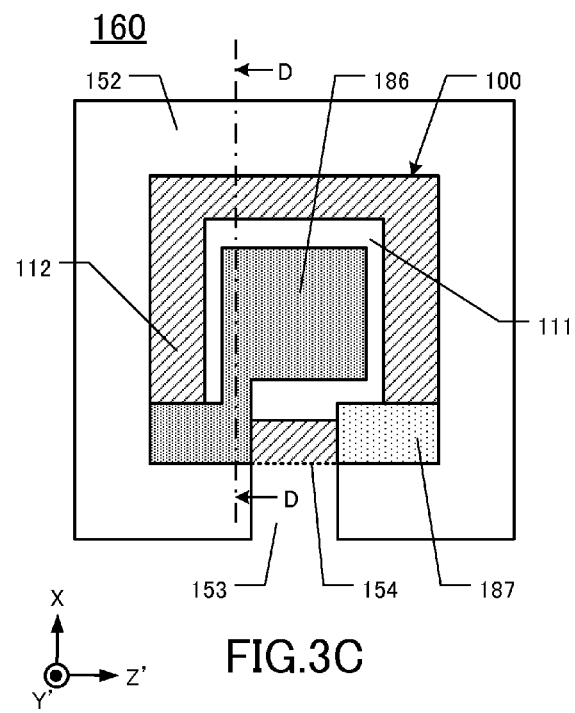
FIG. 3C is a plan view of a first embodiment of a piezoelectric vibrating piece including a mesa region, a peripheral region, and electrodes formed where the piece is mounted to the piezoelectric wafer.

FIG. 3C is a plan view of a piezoelectric vibrating piece 100 (still attached to the wafer) on which a mesa region 111, a peripheral region 112, and electrodes 186, 187 have been formed. Later, each piezoelectric vibrating piece 100 is removed from the wafer 150 by cutting along a dicing line 154 using a dicing saw (not shown).

In FIGS. 4-9 are shown respective portions of a method, according to an embodiment, for manufacturing piezoelectric vibrating pieces 100, as shown in FIG. 3C, from a piezoelectric wafer 150.

FIG. 4 is a flow-chart of a first portion of the method, in which steps are performed to alter the thickness of the piezoelectric substrate where required. The respective results of the steps in FIG. 4 are depicted in adjacent FIGS. 4A-4E. FIGS. 4A-4E are cross-sectional views along the line C-C in FIG. 3A. For easier handling the piezoelectric wafer 150 has a greater thickness than required for the piezoelectric substrate 110. The steps in FIG. 4 result in the thickness of the substrate 110 being reduced to the thickness, denoted TY in FIG. 1B, from the thickness AY of the bare wafer 150

In step S101 metal films are formed on both main surfaces of the bare piezoelectric wafer 150. The metal films, comprising a chromium (Cr) layer and a gold (Au) layer, are formed by vacuum-deposition or sputtering. The Cr layer is formed on the bare wafer 150 first, followed by formation of the Au layer on the Cr layer. Photoresist is then applied to the Au layer by spin-coating to form a photoresist film 142 on each of the +Y'-side and the −Y'side of the wafer (see FIG. 4A).

In step S102 an ultraviolet light is irradiated on the photoresist film 142 on the +Y'-side of the wafer 150. The ultraviolet light is "patterned" by passage through a photo-mask defining multiple piezoelectric substrates 110. The light passing through the regions of the photo-mask defining the substrates exposes respective regions of the photoresist film 142. Then, the photoresist film 142 is developed, followed by removal of the photoresist film 142 from regions defining the piezoelectric substrates 110 (see FIG. 4B).

In step S103 the Au and Cr layers in regions denuded by removal of photoresist 142 are etched (see FIG. 4C). The Au layer is etched using an aqueous solution of iodine and potassium iodide, and the Cr layer is etched using an aqueous solution of cerium(IV) ammonium nitrate and acetic acid, for example. Removing these metal layers exposes corresponding regions of the wafer 150, thereby allowing them to be etched in the next step.

In step S104 the exposed regions of the piezoelectric wafer 150 are etched by a first etchant to reduce the local thickness of the wafer 150 from AY to TY (see FIG. 4D). If the piezoelectric wafer 150 is made of a crystal material, this etching step can be performed by wet-etching using an aqueous solution of 55% hydrofluoric acid or of buffered hydrofluoric acid (a mixture of hydrofluoric acid and ammonium fluoride) as a first etchant. Etching performed using the first etchant produces an etched surface having a mirror-like surface (very smooth, low roughness). One of the scales for indicating surface roughness is the "P-V value" of the surface. The P-V value indicates the maximal height difference from Peak to Valley (i.e., highest microconcavity to lowest point on the surface). The P-V value of the surface produced by the buffered hydrofluoric acid (mixed solution of hydrofluoric acid and ammonium fluoride) is normally $\leq 0.1$ μm. Hereinafter, an etching step that produces a surface having such low roughness is called "mirror-etching," unless otherwise specified.

In step S105 remaining photoresist film 142 and metal film are removed from both main surfaces of the wafer 150 (see FIG. 4E).

FIG. 5 is a flow-chart of the portion of the method directed to forming the through-channels 152 that define the plan profiles of the individual respective substrates. The results of respective steps are shown in the adjacent FIGS. 5A-5F, each being a cross-section along the line C-C in FIG. 3A.

Step S201 is performed on the result of step S105 in FIG. 4. In step S201 a new metal film and photoresist film 142 are formed on both main surfaces of the piezoelectric wafer 150 (see FIG. 5A). The metal films and photoresist films are formed of the same respective materials and in the same manner as in step S101.

In step S202 the photoresist 142 on the first main surface is exposed in locations in which the through-channels 152 are to be formed. This exposure is performed using a photo-mask defining the shapes of the through-channels 152. After exposure the photoresist is developed (see FIG. 5B).

In step S203 the Au layer and Cr layer of the metal film on the first main surface are etched where the through-channels 152 are to be formed (see FIG. 5C). Etching of the metal film is performed as in step S103, which forms correspondingly denuded regions of the underlying piezoelectric wafer 150.

In step S204 the through-channels 152 are formed by etching the denuded regions of the piezoelectric wafer 150 on the first main surface to form the plan profiles of the piezoelectric substrates 110 (see FIG. 5D). Etching progresses depthwise into the piezoelectric wafer 150, and desirably is performed using 55% hydrofluoric acid or buffered hydrofluoric acid, as in step S104.

In step S205 remaining photoresist film 142 on both main surfaces of the wafer is removed (see FIG. 5E).

In step S206, remaining metal film (Au layer and Cr layer) on both main surfaces of the wafer is removed (see FIG. 5F). The condition of the piezoelectric substrate 110 shown in FIG. 5F is the same as the condition of the piezoelectric substrate 110 shown in FIG. 3B. Completing the method through step S206 yields piezoelectric substrates 110 having the desired thickness TY. The main surfaces of each piezoelectric substrate 110 include a mirror surface having a P-V value of less than or equal to 0.1 μm.

FIG. 6 is a flow-chart of the portion of the method directed to forming mesa regions on the piezoelectric substrate. FIGS. 6A-6E show the results of respective steps in the adjacent FIG. 6. Each of FIGS. 6A-6E is a cross-section along the line D-D in FIG. 3C.

Step S301 is performed on the result of step S206 in FIG. 5, and is directed to forming a metal film on both main surfaces of the piezoelectric substrate 110. The metal film comprises a Cr layer formed on the entire surface (both main surfaces and all edge surfaces) of the substrate 110, and a Au layer formed over the Cr layer (see FIG. 6A). The Cr and Au layers are formed by vacuum-deposition or sputtering.

Step S302 involves applying a photoresist film to the metal film. The photoresist is applied on the entire surface of the Au layer by spraying or other suitable technique, followed by spin-coating to form the photoresist film 142 (see FIG. 6B).

Step S303 involves exposing the photoresist film in peripheral regions 112 of each main surface. The center regions of the piezoelectric substrates 110 are not exposed. Exposure is performed using a photo-mask 141 that defines exposures to be made in the peripheral regions 112 (see FIG. 6C, in which the hatched regions of the photoresist film 142 are exposed regions 143).

In step S304 the photoresist film 142 is exposed, followed by removal of photoresist from the peripheral regions 113 exposed by the photo-mask (see FIG. 6D).

Step S305 involves removing the metal film in the peripheral regions 112 denuded in the previous step when the exposed photoresist was removed. In step S305 the Au and Cr layers of the metal film are removed by etching. Etching of the Au layer is performed first, followed by etching of the Cr layer (see FIG. 6E). The central regions (on both main surfaces) of the piezoelectric substrate 110 remain protected from etching by the photoresist film 142 and the metal film (Au layer, Cr layer). These protected regions are "mesa regions" 111, and the denuded regions are "peripheral regions" 112.

Next, the method progresses to portions involving "mesa-process" etching and surface-roughening etching, shown in FIGS. 7 and 8. Mesa-process etching forms the mesa regions 111 of the substrate 110 by etching the peripheral regions 112 denuded in step S305 of FIG. 6. Surface-roughening etching is performed using potassium fluoride (KF), which roughens the surfaces of the peripheral regions 112. FIGS. 7 and 8 are flow-charts depicting alternative schemes for performing mesa-process etching and surface-roughening etching. In FIG. 7 mesa-process etching and surface-roughening etching are performed separately. In FIG. 8, mesa-process etching and surface-roughening etching are performed simultaneously. Step S401 of FIG. 7 and step S501 of FIG. 8 are continued from step S305 of FIG. 6.

FIGS. 7A-7C are cross-sectional views (along the line D-D in FIG. 3C) of the results of respective steps of the method, shown in adjacent FIG. 7.

In step S401 mesa-process etching is performed to form the mesa regions on each piezoelectric substrate 110. The thinner peripheral region 112 surrounding the thicker mesa region 111 is formed by contacting regions of the piezoelectric material, denuded by previous removal of the metal film, with a first etchant (55% hydrofluoric acid or buffered hydrofluoric acid). This "mesa-process" etching into the thickness dimension of the substrate 110 results in formation, on each main surface, of a respective step in the substrate having a height DY (FIG. 7A). Using 55% hydrofluoric acid, an etching time of about two minutes is required to form the mesa region 111 surrounded by a step having a height DY=4 μm. The surface of each step is a mirror surface.

In step S402 surface-roughening etching is conducted on the peripheral regions 112. Surface-roughening etching is performed using potassium fluoride (KF) as a second etchant. Use of this second etchant, which is different from the first etchant (55% HF), exposes the thinner peripheral region 112, roughens the peripheral regions 112 so that their surfaces have more surficial unevenness (larger height differences P-V; about 2 μm) than existed in these regions at the completion of step 401. As the second etchant, potassium fluoride (KF) or 50% hydrofluoric acid at 90° C. can be used. When potassium fluoride (KF) is used, the achieved P-V value of the etched surface is about 2 μm. In the region circumscribed by the dashed-line circle in FIG. 7B (see FIG. 7D) the surface roughened by the second etchant has an irregularly uneven surface having a slope 114. Respective peaks of microconvexities of the roughened surface are not on the same plane, and respective valleys of microconcavities are not on the same plane, either. The maximum P-V value in these roughened regions is preferably in the range: 5%<P-V<50% of DY.

In step S403, remaining photoresist film 142 and metal film (Au layer on Cr layer) on the piezoelectric substrate 110 are removed (see FIG. 7C), yielding a piezoelectric substrate 110 having a respective mesa region 111 on each main surface surrounded by a respective peripheral region 112. The surface of the peripheral regions 112 is roughened to have a P-V value of about 2 μm. The surface of the mesa regions 111 is a mirror surface (P-V value≦0.1 μm).

FIGS. 8A and 8B are cross-sectional views, along the line D-D line of FIG. 3C, of the results of respective steps performed in FIG. 8 on the piezoelectric substrate 110.

Step S501 involves etching to form mesa regions 111 and peripheral regions 112 simultaneously with roughening the surface of each peripheral region. Thus formed are rough peripheral regions 112 exhibiting larger differences in height than the mirror surfaces of the mesa regions 111. This result is achieved by exposing regions of the piezoelectric material, denuded after removing the metal film, to the second etchant. In step S501 the peripheral region 112 is etched using the second etchant to form steps having height DY on each main surface. In other words, the mirror surface of the mesa regions 111 and the rough surface of the peripheral regions 112 are formed concurrently (FIG. 8A). Using KF heated to 90° C. as a second etchant, 30-60 minutes are generally required to etch the step portions having DY=4 μM.

In step S502 remaining photoresist film 142 and metal film are removed (see FIG. 8B), yielding a piezoelectric substrate 110 having a mesa region 111 and surrounding peripheral region 112 on each main surface, with the peripheral regions 112 being roughened and the mesa regions 111 having mirror surfaces.

In FIG. 8, since mesa-process etching and surface-roughening etching are performed simultaneously, this portion of the method has fewer steps than the method portion shown in FIG. 7. However, etching by potassium fluoride (KF) is slow (requiring about an hour), whereas the mesa-process etching step S401 in FIG. 7 is comparatively rapid (two minutes if performed using 55% hydrofluoric acid).

FIG. 9 is a flow-chart of steps in a portion of the method in which electrodes are formed on the piezoelectric substrate 110. The electrode-forming steps include forming excitation electrodes 181, 182 in the mesa regions, and forming extraction electrodes 183, 184 (connected to the excitation electrodes) in the peripheral regions. FIGS. 9A-9D are cross-sectional views, along the line D-D in FIG. 3C, of the results of respective steps in the adjacent FIG. 9. When forming the electrodes on the piezoelectric substrate 110, the electrodes 186, 187 are formed after roughening the peripheral regions 112. Step S601 of FIG. 9 is continued from step S403 of FIG. 7 or step S502 of FIG. 8.

In step S601 a Cr layer is formed on the entire surface of the piezoelectric substrate 110, i.e., the upper, lower, and edge surfaces. The Cr layer is formed by vacuum-deposition or sputtering. An Au layer is formed on the entire surface of the Cr layer by vacuum-deposition or sputtering. Since each mesa region 111 has a mirror surface, the Cr layers as formed on the mesa regions 111 also have a mirror surface, and the Au layers also have a mirror surface in these regions. The surface of the Au layer in the mesa regions has a P-V≦0.1 μm, characteristic of the mirror surfaces in these regions. Since the peripheral regions 112 have rough surfaces, the surfaces of Cr layers formed in these regions are similarly rough, and the surfaces of Au layers formed on the Cr layers in the peripheral regions are also similarly rough, with P-V≧2 μm. Moreover, a photoresist film 142 is formed on the entire surface of the Au layer (see FIG. 9A). The Cr and Au layers can be formed by vacuum-deposition or sputtering. The photoresist film 142 can be applied by spraying or other suitable technique.

In step S602, the photoresist PM is exposed using a photo-mask (not shown) defining the electrodes 186, 187 (see FIG. 9B). The exposed photoresist PM is developed, yielding a photoresist film 142 defining the same profile as of the first and second electrodes 186, 187. Since the electrodes 186, 187 are symmetrical on the upper and lower main surfaces of the piezoelectric substrate 110, a photo-mask having the same pattern may be used for exposing the photoresist on both main surfaces.

In step S603, the Au and Cr layers are etched (see FIG. 9C). First, etching of the Au layer is performed in regions from which the photoresist film 142 has been removed. Then, etching of the Cr layer is performed in regions from which the Au layer has been removed. Thus, regions of the Au layer and Cr layer remain on the substrate where the photoresist has not been exposed.

In step S604, remaining photoresist 142 is removed (see FIG. 9D). The cross-section shown in FIG. 9D is the same as the cross-section along the line D-D in FIG. 3C. Since the peripheral regions 112 are rough, the surface of the Au layer in each of these regions is also (and similarly) rough. As a result, the surface area of each extraction electrode 183, 184 formed in the peripheral regions is greater than of any of the extraction electrodes formed on the mirror surfaces of the mesa regions 111.

As described above, the surface area of an extraction electrode of the piezoelectric vibrating piece 100 can be increased by surface-roughening. However, whenever surface-roughening is performed in conventional methods for fabricating piezoelectric vibrating pieces, it is necessary to form, expose, and develop the metal film and the photoresist film, and then remove the metal film and the photoresist film. In this first embodiment, in contrast, by performing mesa-process etching and surface-roughening etching at the same time or in sequence, process steps are reduced in number.

In this first embodiment, potassium fluoride (KF) is used for surface-roughening etching. KF is a solid at a room temperature and is deliquescent. An aqueous solution of KF indicates an alkalescent.

Wet-etching to roughen a surface can be performed using either potassium fluoride (KF) or a high concentration (e.g., 50%) of hydrofluoric acid at high temperature (e.g., 90° C.). Alternatively, dry-etching may be performed, using CF$_4$, C$_4$F$_8$, or CHF$_3$. Further alternatively, surface-roughening can be done by sand-blasting, as described later below.

The sequence of steps in FIG. 5 for forming the through-channel can be performed within the steps for forming the piezoelectric vibrating piece 100. For example, the sequence can be performed after mesa-processing described in connection with FIG. 8 or before adjusting the thickness of the piezoelectric substrate 110, described with reference to FIG. 4.

Second Embodiment of Piezoelectric Vibrating Piece

The piezoelectric vibrating piece 100 of the first embodiment includes respective mesa regions 111 on both the upper and lower main surfaces of the piece. In this second embodiment, a mesa region 111 is formed on only one main surface of the piezoelectric vibrating piece 200.

Figure 10A:
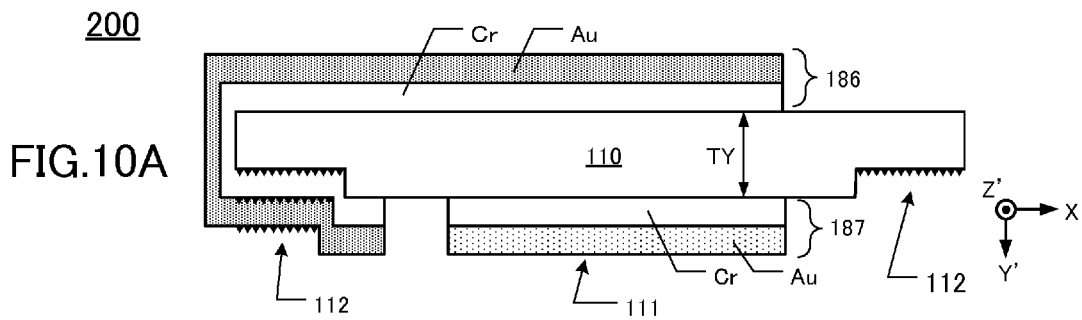
FIG. 10A is a cross-section of a second embodiment of a piezoelectric vibrating piece.

FIG. 10A is a cross-sectional view of the piezoelectric vibrating piece 200 of this embodiment. The mesa region 111 is formed on the +Y'-side main surface of the piece 200, and is surrounded by a peripheral region 112. The surface of the peripheral region 112 on the +Y'-side is roughened so that extraction electrodes 183, 184 formed thereon have correspondingly rough surfaces providing large surface areas. It is possible to perform this surface-roughening also on the −Y'-side where mesa-processing is not performed. However, surface-roughening is more efficiently performed if performed only on the main surface on which mesa-processing is performed. Thus, in this embodiment only the peripheral region 112 located on the same side (the +Y'-side) as the mesa region 111 is roughened.

Figure 10B:
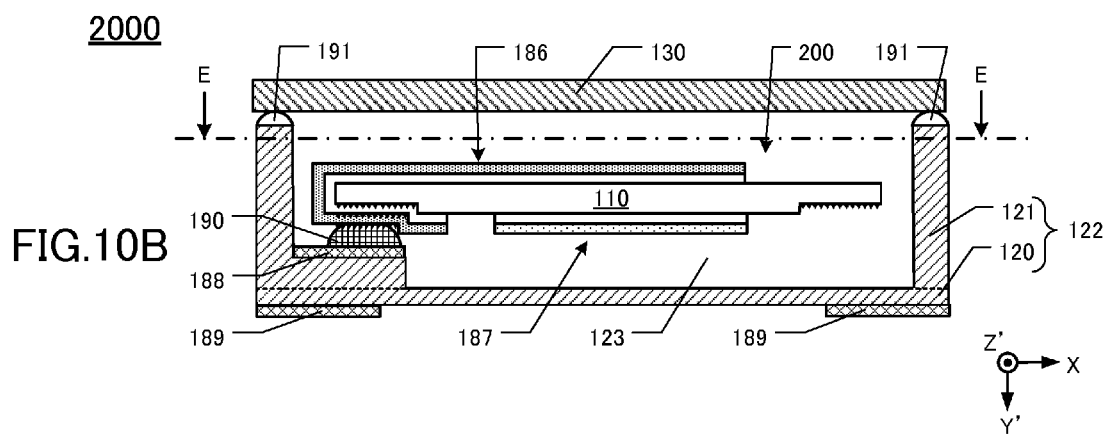
FIG. 10B is a cross-section of a second embodiment of a piezoelectric vibrator.
Figure 10C:
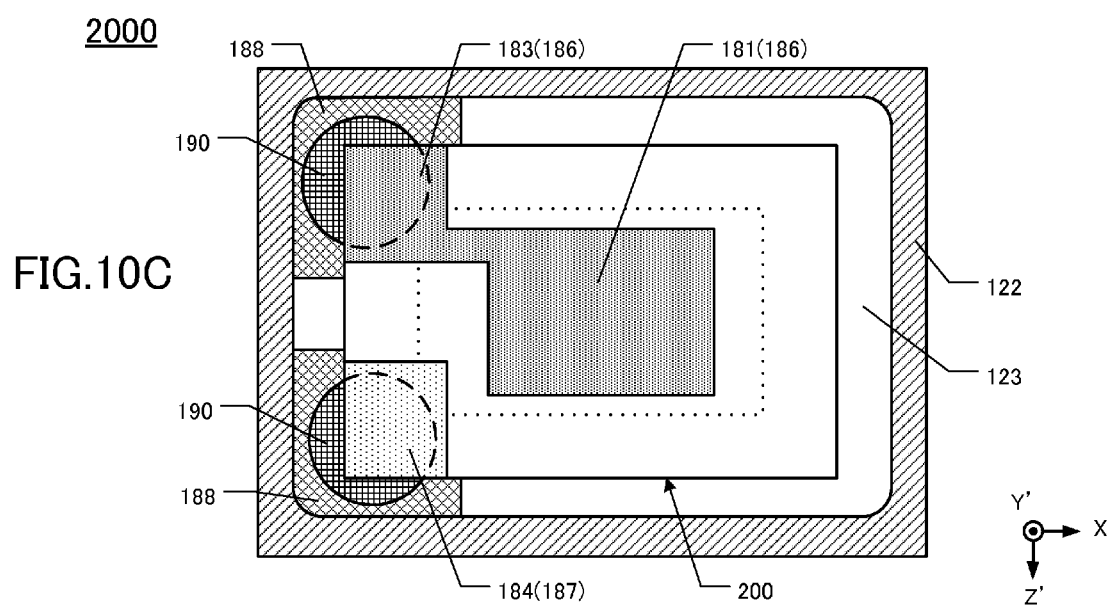
FIG. 10C is a cross-section along the line E-E in FIG. 10B.

FIG. 10B is a cross-section of a piezoelectric vibrator 2000 incorporating the vibrating piece 200 in a "package." FIG. 10C is a cross-section along the line E-E in FIG. 10B. Specifically, the piezoelectric vibrator 2000 comprises a lid 130, a package 122, and the piezoelectric vibrating piece 200. The package 122 is essentially a box defining a cavity 123 and comprising sides 121 and a base 120. Similar to the package of the first embodiment, the package 122 of the second embodiment includes connecting electrodes 188 and respective external electrodes 189. Respective connecting electrodes are electrically connected to the extraction electrodes 183, 184 of the piezoelectric vibrating piece 200 using electrically conductive adhesive 190. Because the surfaces of the extraction electrodes 183, 184, formed in the rough-surfaced peripheral regions 112 of the piezoelectric vibrating piece 200, are similarly rough, the bonding areas for electrically conductive adhesive 190 on the extraction electrodes 183, 184 are greater than they otherwise would be if the extraction electrodes 183, 184 had been formed on mirror surfaces. With this enhanced surface roughness, the strength by which the adhesive 190 bonds to the extraction electrodes 183, 184 is correspondingly increased, with accompanying increases in electrical conductivity.

Second Embodiment of Method for Manufacturing Piezoelectric Vibrating Piece

This embodiment is similar in many ways to the method shown in FIGS. 4-9. For forming the mesa region 111 on only the main surface on the +Y'-side, only the photoresist film 142 on the +Y'-side main surface is exposed in step S303 of FIG. 6. Consequently, mesa-process etching and surface-roughening are performed only on the +Y'-side main surface.

Third Embodiment of Method for Manufacturing Piezoelectric Vibrating Piece

The foregoing first and second method embodiments include processing of a piezoelectric substrate 110 having at least one mesa region 111. Surface-roughening can be performed on a main surface of a piezoelectric substrate 110 that lacks a mesa region. Surface-roughening also can be performed on peripheral regions of substrates 110 in which the mesa region 111 is thinner than the thickness of the peripheral regions 112 (called an "inverted mesa"). Surface-roughening of a piezoelectric substrate 110 having at least one main surface configured as an inverted mesa is described below.

FIG. 11 is a flow-chart of a surface-roughening method as performed on a main surface of a piezoelectric substrate. The results of respective steps are shown in cross-section in FIGS. 11A-11F.

Step S701 continues from step S205 of FIG. 5. In step S701 a photoresist film 142 is formed by applying a photoresist to all surfaces of the piezoelectric wafer 150 and the piezoelectric substrate 110 (see FIG. 11A).

In step S702 the photoresist film 142 is exposed and developed using a photo-mask defining the peripheral regions 112 on the piezoelectric substrate 110 (see FIG. 11B).

In step S703 the metal film (Au layer on a Cr layer), denuded by exposure and subsequent removal of the photoresist film 142, is removed by etching (see FIG. 11C).

In step S704 the peripheral region 112 of the piezoelectric substrate 110 is surface-roughened by KF etching (see FIG. 11D). Note that FIG. 11D is an enlargement of the region circumscribed by the dotted line 170 in FIG. 11C.

In step S705 the photoresist film 142 on the piezoelectric substrate 110 is removed (FIG. 11E), and in step S706 the metal film (Au layer on a Cr layer) on the piezoelectric substrate 110 is removed (see FIG. 11F).

After step S706 the electrodes are formed, using the method portion shown in FIG. 9. Since the peripheral region 112 on the +Y'-side has been roughened, the respective surface area of the extraction electrode formed on the surface of the peripheral region 112 is correspondingly increased.
Surface-Roughening Inverted Mesa Type Piezoelectric Substrate FIG. 12 is a flow-chart of steps for roughening the surface of an "inverted-mesa" type piezoelectric substrate. In an inverted-mesa configuration, the middle region is thinner than the peripheral region.

In step S801 a metal film (Au layer on Cr layer) is formed on the piezoelectric wafer 150, followed by formation of a photoresist film 142 on the metal film (see FIG. 12A).

In step S802 the photoresist film 142 is exposed and developed using a photo-mask defining the pattern of the inverted-mesa regions 113. Also in this step, the metal film (Au layer on Cr layer) formed on the inverted-mesa portion 113 is removed by etching (see FIG. 12B).

In step S803 the piezoelectric wafer 150 is placed in the first wet-etchant (55% hydrofluoric acid or buffered hydrofluoric acid) to form the inverted-mesa regions 113. Then, remaining photoresist film 142 and metal film are removed (see FIG. 12C).

In step S804 the metal film (Au layer on Cr layer) is formed on the piezoelectric wafer 150 and on the photoresist film 142 formed on the Au layer. Also in this step, the photoresist film 142 is exposed and developed using a photo-mask defining the pattern of the peripheral region 112. Then, residual metal film in the peripheral regions 112 is removed by etching (FIG. 12D).

In step S805 the peripheral region 112 is roughened by etching using KF (the second etchant) (see FIG. 12E).

In step S806 residual photoresist film 142 and metal film are removed (see FIG. 12F). FIG. 12F shows a region in which two inverted-mesa type piezoelectric vibrating pieces are formed. Electrodes are formed on the surface and then each piezoelectric vibrating piece is detached from the piezoelectric wafer.

Fourth Embodiment of Surface-Roughening Method

In the foregoing embodiments, surface-roughening was performed by wet-etching or dry-etching. Alternatively, a surface can be roughened by sand-blasting, as described below with reference to FIG. 13.

Figure 13A:
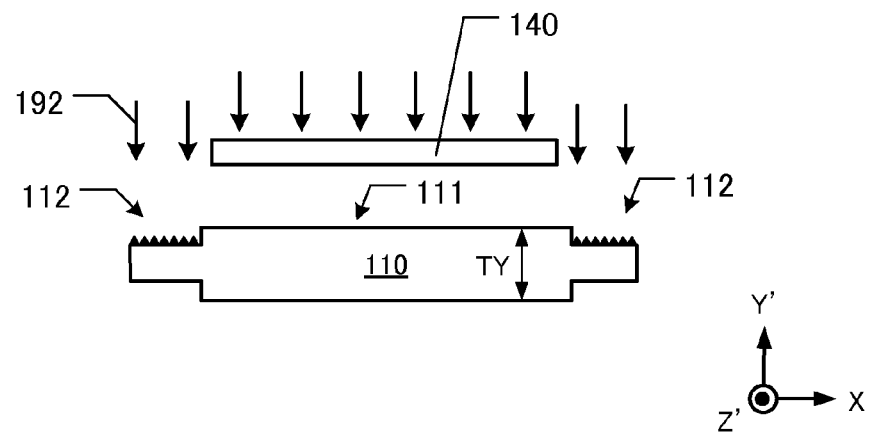
FIG. 13A is a schematic depiction of surface roughening by sand-blasting on a mesa-processed piezoelectric substrate.

FIG. 13A shows sand-blasting of a mesa-processed piezoelectric substrate 110. The sand-blasted surface is produced by discharging a stream of suspended particles of an abrasive 192 on selected regions of the surface of the piezoelectric substrate 110. The discharged stream of abrasive particles roughens the surface of the piezoelectric substrate 110 in regions not protected by the metal mask 140. In FIG. 13A only the peripheral region 112 of the piezoelectric substrate 110 is roughened as the mesa region 111 is being protected by the metal mask 140. Roughening of the peripheral region 112 in this manner yields a P-V=10 to 30 μm. The P-V value depends upon the size of particles in the abrasive 192; the larger the particles, the greater the P-V.

Sand-blasting does not require forming a metal film or a photoresist film to define regions for roughening. Sand-blasting also does not require lithographic exposure and development of a photoresist, or removal of the metal film and remaining photoresist film. Rather, sand-blasting is a simple process that simply requires discharging the abrasive 192 to selected target regions through a metal mask 140. Surface-roughening by sand-blasting can be performed on not only mesa-type piezoelectric substrates 110, but also on inverted-mesa configurations of the piezoelectric substrate 110.

Figure 13B:
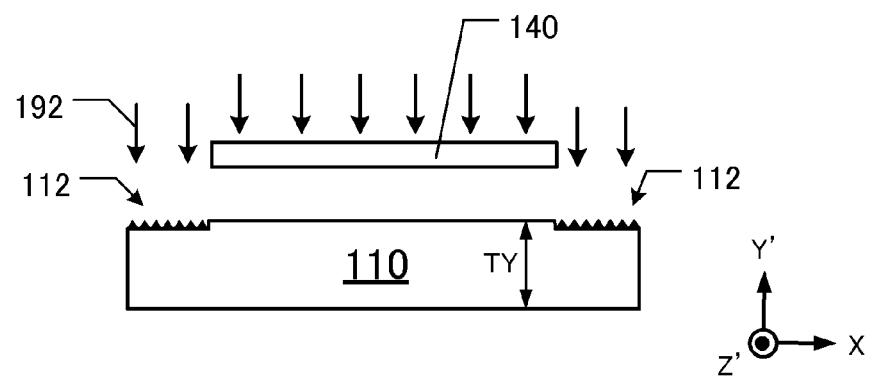
FIG. 13B is a schematic depiction of surface roughening by sand-blasting on a plate piezoelectric substrate.

FIG. 13B shows roughening of the piezoelectric substrate 110 by sand-blasting. As shown in FIG. 11, surface-roughening can alternatively be performed by wet-etching; but, this would require performing the following steps on a bare wafer: applying photoresist, exposing the photoresist, developing the photoresist, etching, and removing residual photoresist. By sand-blasting instead, selected regions (e.g., the peripheral regions 112) of the wafer surface 150 can be roughened directly (see FIG. 5F) because the selected regions are already bare.

Figure 13C:
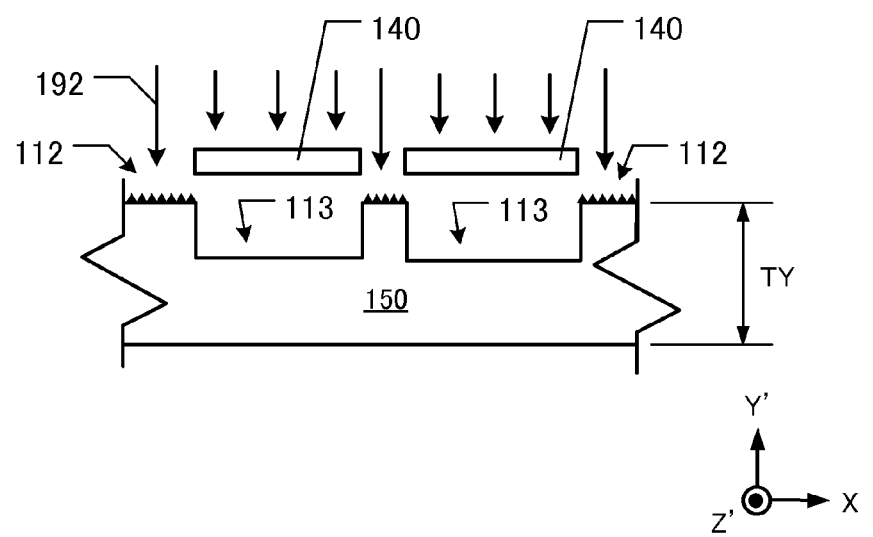
FIG. 13C is a schematic depiction of surface roughening by sand-blasting on an inverted-mesa type piezoelectric substrate.

FIG. 13C shows sand-blasting to roughen selected regions of an inverted-mesa piezoelectric substrate 110. Surface-roughening could be performed by wet-etching (FIG. 12), but this would require performing the following steps on a bare wafer: applying photoresist, exposing the photoresist, developing the photoresist, etching, and removing residual photoresist. By sand-blasting instead, selected regions (e.g., the peripheral regions 112) of the wafer surface 150 can be roughened directly (see FIG. 12C) because the selected regions are already bare.

Simultaneously Forming Mesa Regions and Roughened Surfaces by Sand-Blasting

Surface-roughening and forming mesa regions can be performed simultaneously by sand-blasting, as described below with reference to FIG. 14. FIG. 14 is a flow-chart of an embodiment of a method for performing both surface-roughening and mesa-processing by sand-blasting of selected regions of a piezoelectric substrate. FIGS. 14A-14F depict the results of respective steps shown in the adjacent flow-chart of FIG. 14.

Step S901 continues from step S206 of FIG. 5. In step S901 a photoresist film 142 is applied to all surfaces of the piezoelectric wafer 150, including all surfaces of the piezoelectric substrates 110 thereon (see FIG. 14A).

In step S902 the photoresist film 142 is exposed using a photo-mask 144 that defines circumferential regions 115 destined to become part of the peripheral regions 112 of the piezoelectric substrate 110. Exposure produces exposed regions 143 of the photoresist film 142 (see FIG. 14B, in which the hatched regions denote exposed regions 143).

In step S903 the exposed regions 143 of the photoresist film 142 are developed and removed, thereby denuding the circumferential regions 115 (see FIG. 14C). Note that the peripheral edges 145 of the remaining photoresist film 142 are sharp.

In step S904 the photoresist film 142 is heat-treated, which rounds the peripheral edges 145 to form slopes 146. Note that each peripheral region 112 includes a respective circumferential region 115 and a respective slope 146 (see FIG. 14D). The slopes 146 connect the central region of the piezoelectric substrate 110 with the circumferential regions 115 of the peripheral regions 112. Each slope 146 is tilted at an angle 147 from the X-Z' plane to the Y'-axis. The angle 147 is desirably between 5° and 80°. The angle 147 can be controlled by controlling the thickness of the photoresist film 142 as well as the time and temperature under which heat-treating is conducted.

In step S905 mesa-processing and surface-roughening are performed simultaneously on the piezoelectric substrate 110 by sand-blasting. As sand-blasting is being performed, the shape of the piezoelectric substrate 110 is copied as the shape of the main surfaces of the piezoelectric substrate 110 shown in FIG. 14D. In other words, the shape of the piezoelectric substrate 110 after sand-blasting is of the photoresist film 142 after heat-treating (FIG. 14D), wherein the mesa region 111 is formed in a central region of the piezoelectric substrate 110. Also, meanwhile, the surface of the peripheral regions 112 is roughened.

In step S906 excitation electrodes and extraction electrodes are formed on the piezoelectric substrate 110 using the process shown in FIG. 9. Since the peripheral regions 112 have been roughened, the respective extraction electrodes formed on these surfaces are correspondingly rough, providing them with correspondingly increased surface areas.

The invention has been described above in the context of representative embodiments. It will be obvious to persons of ordinary skill in the relevant art to modify the invention based on this disclosure.

For example, in the described embodiments of piezoelectric vibrating devices a lid is bonded to a package in which a piezoelectric vibrating piece is mounted. However, in other embodiments the piezoelectric vibrating piece comprises a vibrating portion and a frame portion, wherein a lid and package are bonded to the frame portion to form the device. In such piezoelectric vibrating pieces, the excitation electrodes are formed on the vibrating portion, and the frame portion surrounds the vibrating portion. Multiple lids, packages, and piezoelectric vibrating pieces can be made simultaneously on respective wafers, wherein the wafers are bonded together (with lids, packages, and vibrating pieces all registered with one another) using an adhesive or other sealant to form multiple piezoelectric vibrating devices. Methods as described herein can be used to roughen the bonding surfaces of the frame portions, thereby increasing the strength of the bonds between the wafers. Whenever the vibrating portion has a mesa configuration and a rough peripheral region, as described herein, certain unnecessary vibrations (having complex causes) are attenuated as the CI value of the device is reduced.

Moreover, in the described embodiments a piezoelectric crystal material is used as the substrates 110. However, this is just one example. Alternatively, $LiTaO_3$ (lithium tantalite) can be used as the piezoelectric material. Also, Ag can be used instead of Au, and nickel Ni, titanium Ti, or tungsten W can be used instead of chromium Cr.

The embodiments herein were described herein in the context of using an AT-cut crystal piece. Alternatively, a BT-cut crystal piece or tuning-fork type crystal piece can be used. As a piezoelectric device, besides the piezoelectric vibrator, a piezoelectric oscillator incorporating an integrated circuit IC including an oscillating circuit can be provided.

Further, the embodiments herein can be applied to, for example, the manufacture of a monolithic filter having a plurality of vibrating regions electrically connected to each other on a single piezoelectric substrate 110.

What is claimed is:

1. A piezoelectric vibrating piece, comprising:
   a piezoelectric substrate comprising first and second main surfaces;
   a respective first region formed on at least one of the first and second main surfaces, the at least one first region including a respective surface having a first degree of irregular unevenness;
   a respective second region surrounding each first region, the second region including a respective surface having a second degree of irregular unevenness that is greater than the first degree;
   a respective excitation electrode located in each first region; and
   a respective extraction electrode located in each second region and electrically connected to the respective excitation electrode, each extraction electrode having a respective surface that is irregularly uneven according to the irregular unevenness of the second region.

2. The piezoelectric vibrating piece of claim 1, wherein:
   the second degree of irregular unevenness of the surface of the second region is due, at least in part, to the surface in the second region having surficial microconvexities that extend to irregular different heights, the microconvexities being larger and exhibiting a greater P-V value than microconvexities in the first region; and the irregularly uneven surface of the respective extraction electrode in the second region is due, at least in part, to formation of the extraction electrode on the respective microconvexities in the second region.

3. The piezoelectric vibrating piece of claim 1, wherein:

each first region is centrally located on the respective main surface of the piezoelectric substrate;

each excitation electrode is centrally located in the respective first region; and each respective second region extends peripherally around the respective first region.

4. The piezoelectric vibrating piece of claim 3, wherein:

the first region on at least one main surface of the piezoelectric substrate is configured as a mesa relative to the respective second region;

the mesa has a height TY relative to the respective second region; and the second degree of irregular unevenness exhibited by the second region is characterized by a maximum difference in P-V height on the second region of $50\% \leqq (P-V) \geqq 5\%$ of TY.

5. The piezoelectric vibrating piece of claim 3, wherein:

the first region on at least one main surface of the piezoelectric substrate is configured as a mesa relative to the respective second region, the mesa having a main surface;

the second region includes a circumferential region of the piezoelectric vibrating piece;

the circumferential region is connected to the first region by a slope; and the slope is angled at less than 90° relative to the main surface of the mesa.

6. A piezoelectric device comprising:

a piezoelectric vibrating piece as recited in claim 1;

a package defining a cavity in which the piezoelectric vibrating piece is mounted;

a connecting electrode situated in the cavity;

a lid affixed to the package to seal the cavity; and an electrically conductive adhesive placed to connect together the extraction electrode and the connecting electrode.

\* \* \* \* \*